US 12,500,218 B2

(12) United States Patent
Kim et al.

(10) Patent No.: US 12,500,218 B2
(45) Date of Patent: Dec. 16, 2025

(54) FAN-OUT SEMICONDUCTOR PACKAGE

(71) Applicant: Samsung Electronics Co., Ltd., Suwon-si (KR)

(72) Inventors: Dahee Kim, Cheonan-si (KR); Gookmi Song, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 517 days.

(21) Appl. No.: 17/884,668

(22) Filed: Aug. 10, 2022

(65) Prior Publication Data

US 2023/0052194 A1 Feb. 16, 2023

(30) Foreign Application Priority Data

Aug. 10, 2021 (KR) .................. 10-2021-0105481

(51) Int. Cl.
| | | |
|---|---|---|
| H01L 25/18 | (2023.01) | |
| H01L 23/31 | (2006.01) | |
| H01L 23/498 | (2006.01) | |
| H01L 23/00 | (2006.01) | |

(52) U.S. Cl.
CPC .......... *H01L 25/18* (2013.01); *H01L 23/3128* (2013.01); *H01L 23/49816* (2013.01); *H01L 23/49822* (2013.01); H01L 24/48 (2013.01); H01L 2224/48225 (2013.01)

(58) Field of Classification Search
None
See application file for complete search history.

(56) References Cited

U.S. PATENT DOCUMENTS

| | | |
|---|---|---|
| 6,863,109 B2 | 3/2005 | Kim et al. |
| 10,050,016 B2 | 8/2018 | Lee et al. |
| 10,157,835 B2 | 12/2018 | Yu et al. |
| 10,325,879 B2 | 6/2019 | Yu et al. |

(Continued)

FOREIGN PATENT DOCUMENTS

| | | |
|---|---|---|
| KR | 10-0484088 B1 | 4/2005 |
| KR | 10-2012-0035725 A | 4/2012 |

(Continued)

OTHER PUBLICATIONS

Office Action issued on Jul. 16, 2025 in Korean Application No. 10-2021-0105481.

*Primary Examiner* — Kyoung Lee
(74) *Attorney, Agent, or Firm* — Harness, Dickey & Pierce, P.L.C.

(57) ABSTRACT

Provided is a fan-out semiconductor package including a package body having a fan-in region and a fan-out region, the fan-out region surrounding the fan-in region and including a body wiring structure; a fan-in chip structure in the fan-in region, the fan-in chip structure comprising a chip and a chip wiring structure on a top surface of the chip; a first redistribution structure on a bottom surface of the package body and a bottom surface of the fan-in chip structure, the first redistribution structure comprising first redistribution elements extending towards the fan-out region; and a second redistribution structure on a top surface of the package body and a top surface of the chip wiring structure, the second redistribution structure comprising second redistribution elements extending towards the fan-out region.

20 Claims, 23 Drawing Sheets

(56) References Cited

U.S. PATENT DOCUMENTS

| | | |
|---|---|---|
| 10,748,856 B2 | 8/2020 | Moon et al. |
| 10,950,556 B2 | 3/2021 | Wu et al. |
| 2012/0013021 A1* | 1/2012 | Kobayashi .............. H01L 24/19 |
| | | 257/E21.597 |
| 2018/0096968 A1* | 4/2018 | Lee .................... H01L 25/0652 |
| 2020/0203303 A1* | 6/2020 | Lin ........................ H01L 24/13 |
| 2021/0066254 A1 | 3/2021 | Yu et al. |

FOREIGN PATENT DOCUMENTS

| | | |
|---|---|---|
| KR | 10-2020-0120374 A | 10/2020 |
| KR | 10-2020-0137220 A | 12/2020 |

\* cited by examiner

FAN-OUT SEMICONDUCTOR PACKAGE

CROSS-REFERENCE TO RELATED APPLICATION

This application is based on and claims priority under 35 U.S.C. § 119 to Korean Patent Application No. 10-2021-0105481, filed on Aug. 10, 2021, in the Korean Intellectual Property Office, the disclosure of which is incorporated by reference herein in its entirety.

BACKGROUND

The inventive concepts relate to a semiconductor package, and more particularly, to a fan-out semiconductor package, and/or a method of manufacturing the same.

According to the rapid developments in the electronic industry and the demands of users, electronic devices are becoming smaller and lighter, and accordingly, the size of a chip (e.g., a semiconductor chip), which is a core component of an electronic device, is gradually decreasing. On the other hand, since the spacing between solder balls on a chip (e.g., a semiconductor chip) is determined by the international standard of the World Semiconductor Standards Association, it is not always possible and/or easy to adjust the number of solder balls for a chip. To solve this problem, a fan-out semiconductor package has been proposed.

SUMMARY

At least one embodiment of the inventive concepts provides a fan-out semiconductor package capable of increasing chip design freedom.

According to an aspect of the inventive concepts, there is provided a package body having a fan-in region and a fan-out region, the fan-out region surrounding the fan-in region and including a body wiring structure; a fan-in chip structure in the fan-in region, the fan-in chip structure comprising a chip and a chip wiring structure on a top surface of the chip; a first redistribution structure on a bottom surface of the package body and a bottom surface of the fan-in chip structure, the first redistribution structure comprising first redistribution elements extending towards the fan-out region; and a second redistribution structure on a top surface of the package body and a top surface of the chip wiring structure, the second redistribution structure comprising second redistribution elements extending towards the fan-out region.

According to another aspect of the inventive concepts, there is provided a fan-out semiconductor package including a package body having a fan-in region and a fan-out region, the fan-out region surrounding the fan-in region and including a body wiring structure; a fan-in chip structure in the fan-in region, the fan-in chip structure comprising a first chip, a second chip bonded to the first chip, and a chip wiring structure on a top surface of the second chip; a first redistribution structure on a bottom surface of the package body and a bottom surface of the first chip, the first redistribution structure comprising first redistribution elements extending towards the fan-out region; and a second redistribution structure on a top surface of the package body and a top surface of the chip wiring structure, the second redistribution structure comprising second redistribution elements extending towards the fan-out region.

According to another aspect of the inventive concepts, there is provided a fan-out semiconductor package including a package body having a fan-in region and a fan-out region, the fan-out region surrounding the fan-in region and including a body wiring structure; a fan-in chip structure in the fan-in region, the fan-in chip structure comprising stacked chips and a chip wiring structure on a top surface of the stacked chips; a first redistribution structure on a bottom surface of the package body and a bottom surface of the fan-in chip structure, the first redistribution structure comprising first redistribution elements extending towards the fan-out region; and a second redistribution structure on a top surface of the package body and a top surface of the chip wiring layer, the second redistribution structure comprising second redistribution elements extending towards the fan-out region.

BRIEF DESCRIPTION OF THE DRAWINGS

Some example embodiments of the inventive concepts will be more clearly understood from the following detailed description taken in conjunction with the accompanying drawings in which.

DETAILED DESCRIPTION OF THE EMBODIMENTS

Figure 1:
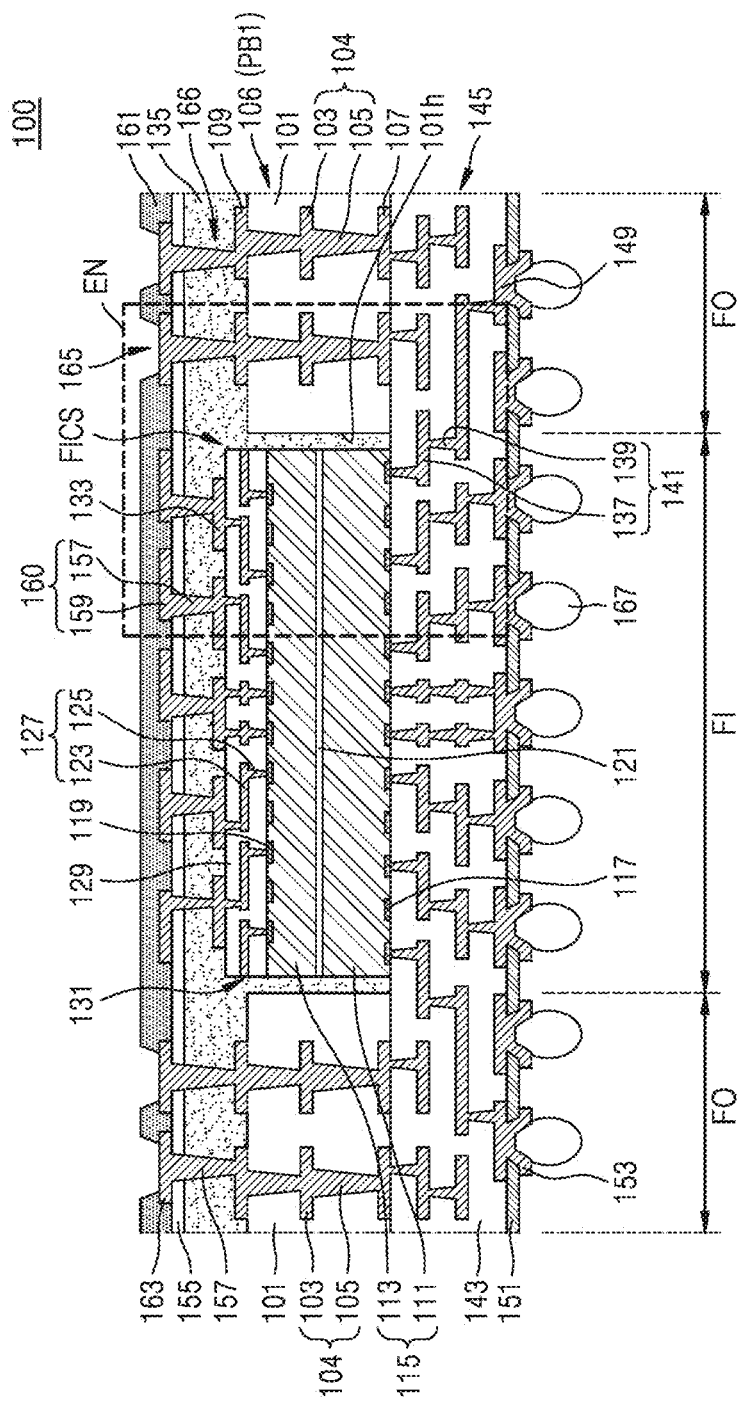
FIG. 1 is a cross-sectional view of a main part of a fan-out semiconductor package according to some example embodiments.

Hereinafter, example embodiments will be described in detail with reference to the accompanying drawings, wherein like reference numerals refer to like elements throughout.

Spatially relative terms such as "top," "bottom," "below," "above," "under," etc. may be used herein for ease of description to describe one element's relationship to another element, e.g., as shown in the figures. Such spatially relative terms are intended to encompass different orientations of the device in use or operation in addition to the orientation depicted in the figures. For example, the device may also be oriented in other ways (for example, turned over, and/or rotated 90 degrees and/or at other orientations), and the spatially relative terms used herein are to be interpreted accordingly.

Figure 2:
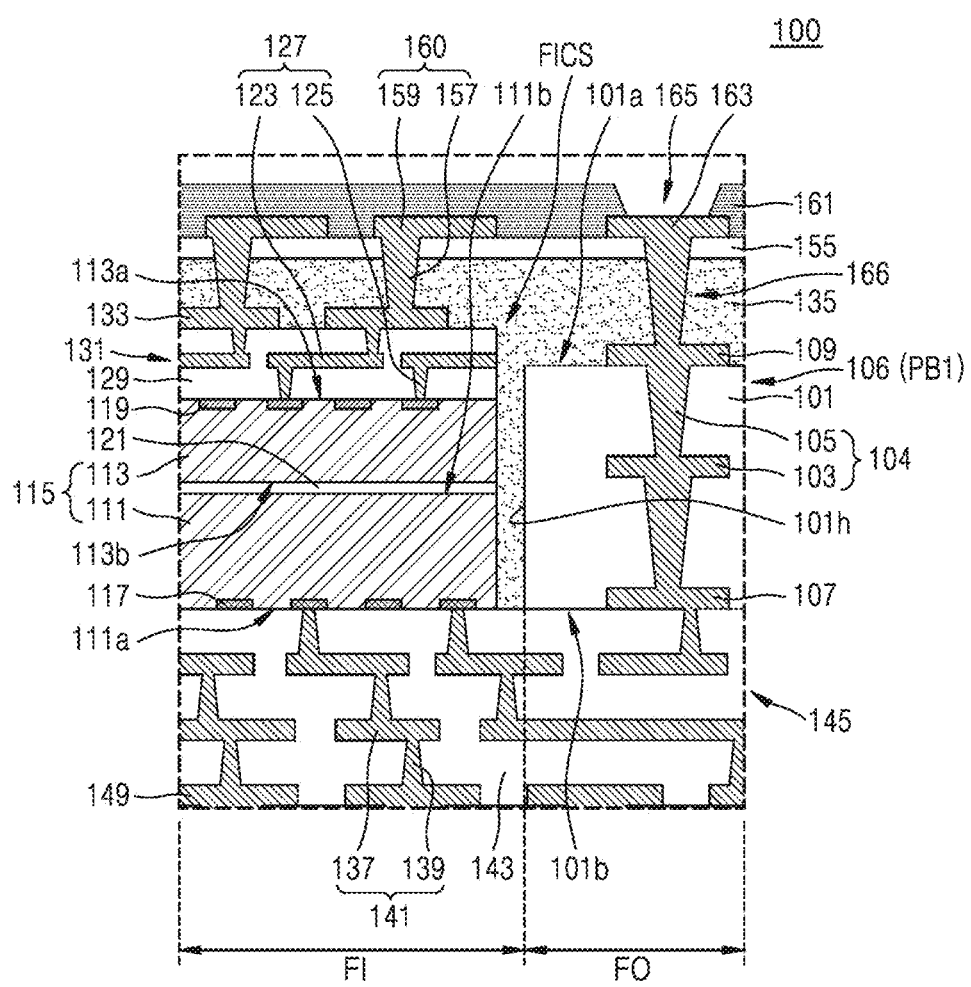
FIG. 2 is an enlarged view of a portion "EN" of FIG. 1.

FIG. 1 is a cross-sectional view of a main part of a fan-out semiconductor package 100 according to some example embodiments of the inventive concepts, and FIG. 2 is an enlarged view of a portion "EN" of FIG. 1.

The fan-out semiconductor package 100 may include a wiring substrate 106 having a fan-in region FI corresponding to a via hole 101h provided in a body 101 and a fan-out region FO arranged on both sides of the fan-in region FI. The fan-out region FO may surround the fan-in region FI when viewed from above (e.g., in a plan view).

The wiring substrate 106 may be a package body PB1. The wiring substrate 106 may be an insulation substrate. For example, the wiring substrate 106 may be a printed circuit board. The wiring substrate 106 may be referred to as a frame substrate. The fan-out semiconductor package 100 may be, e.g., a package in the form of a fan-out panel level package (FOPLP). The wiring substrate 106 may include a body 101 positioned on both sides of the via hole 101h, a body wiring structure 104 formed in the body 101, and body wiring pads 107 and 109.

The via hole 101h may penetrate through a top surface 101a and a bottom surface 101b of the body 101. The body 101 may include an organic based insulator, for at example at least one material selected from among phenol resin, epoxy resin, and/or polyimide. For example, the body 101 may include at least of Frame Retardant 4 (FR4), tetrafunctional epoxy, polyphenylene ether, epoxy/polyphenylene oxide, bismaleimide triazine (BT), an aramid-polyimide composite material (such as Thermount), cyanate ester, polyimide, liquid crystal polymer, and/or the like.

The body wiring structure 104 may include body wiring layers 103 formed in the body 101 and body vias 105 connecting the body wiring layer 103 to one another. The body wiring pads 107 and 109 may include a first body wiring pad 107 located on the bottom surface 101b of the body 101 and electrically connected to the body wiring structure 104 and a second body wiring pad 109 located on the top surface 101a of the body 101 and electrically connected to the body wiring structure 104.

The first body wiring pad 107 may be a part of the body wiring layer 103 located on the bottom surface 101b of the body 101. The second body wiring pad 109 may be a part of the body wiring layer 103 located on the top surface 101a of the body 101.

The body wiring layer 103, the body via 105, and the body wiring pads 107 and 109 may include a conductive material, and may be, e.g., included in (and/or include) metal layers. For example, the body wiring layer 103 and the body wiring pads 107 and 109 may each include at least one of an electrolytically deposited (ED) copper foil, a rolled-annealed (RA) copper foil, a stainless steel foil, an aluminum foil, an ultra-thin copper foil, sputtered copper, a copper alloy, etc. The body via 105 may include, for example, at least one of copper, nickel, stainless steel, beryllium copper, etc.

The fan-out semiconductor package 100 may include a fan-in chip structure FICS disposed in the via hole 101h. The fan-in chip structure FICS may be referred to as a fan-in chip package structure. In some embodiments, a portion of the wiring substrate 106 corresponding to the fan-in chip structure FICS may correspond to the fan-in region FI. The remaining portion of the wiring substrate 106 other than the via hole 101h may correspond to the fan-out region FO.

In some embodiments, the top surface of the fan-in chip structure FICS may be located at a level higher than that of the top surface of the wiring substrate 106. In some embodiments, the fan-in chip structure FICS may be embedded in the via hole 101h.

The fan-in chip structure FICS may include stacked chips 115 and a chip wiring structure 131. The chip wiring structure 131 may be referred to as a chip redistribution structure. The stacked chips 115 may include a first chip 111 and a second chip 113. The fan-out semiconductor package 100 may include the stacked chips 115 to improve an integration capacity. Although the present embodiment is described in relation to the stacked chips 115, the inventive concepts are not so limited and may also be applied to a single chip and/or more chips.

In some embodiments, the stacked chips 115 may include individual devices. The individual devices may include various microelectronic devices, e.g., a metal-oxide-semiconductor field effect transistor (MOSFET) like a complementary metal-insulator-semiconductor transistor (CMOS transistor), a system large scale integration (LSI), an image sensor like a CMOS imaging sensor (CIS), a micro-electromechanical system (MEMS), an active device, a passive device, etc.

In the stacked chips 115, the second chip 113 may be stacked on the first chip 111. In the stacked chips 115, the first chip 111 and the second chip 113 may be bonded to each other through an adhesive layer 121. In some embodiments, the first chip 111 and the second chip 113 may be of the same type. The first chip 111 and/or the second chip 113 may each be a logic chip, a power management integrated circuit (PMIC) chip, a memory chip, etc. In some embodiments, a logic chip may each be, for example, a center processing unit (CPU) chip, a graphics processing unit (GPU) chip, an application processor (AP) chip, etc.

In some embodiments, a memory chip may be a dynamic random access memory (DRAM) chip, a static random access memory (SRAM) chip, a flash memory chip, an electrically erasable and programmable read-only memory, (EEPROM) chip, a phase-change random access memory (PRAM) chip, a magnetic random access memory (MRAM) chip, a resistive random access memory (RRAM) chip, etc.

In some embodiments, the first chip 111 and the second chip 113 may be chips of different types. For example, one of the stacked chips 115 (e.g., the first chip 111) may be a logic chip as described above, and the remaining one of the stacked chips 115 (e.g., the second chip 113) may be a memory chip as described above.

The first chip 111 may have a bottom surface 111a and a top surface 111b. The bottom surface 111a may be an active surface on which individual elements are formed, and the top surface 111b may be an inactive surface on which individual elements are not formed. The bottom surface 111a, which is an active surface on which individual devices are formed, of the first chip 111 may face downward.

The second chip 113 may have a top surface 113a and a bottom surface 113b. The top surface 113a may be an active surface on which individual elements are formed, and the bottom surface 113b may be an inactive surface on which individual elements are not formed. The top surface 113a, which is an active surface on which individual devices are formed, of the second chip 113 may face upward.

In the stacked chips 115, the top surface 111b of the first chip 111 and the bottom surface 113b of the second chip 113 may be bonded to each other via the adhesive layer 121. A first chip pad 117 may be disposed on the bottom surface 111a of the first chip 111. A second chip pad 119 may be disposed on the top surface 113a of the second chip 113. The first chip pad 117 and the second chip pad 119 may include an electrically conductive material and may be conductive pads such as metal pads (e.g., aluminum pads and/or copper pads). The first chip pad 117 and the second chip pad 119 may be referred to as electrically conductive pads.

The chip wiring structure 131 may be disposed on the second chip 113. The chip wiring structure 131 may be disposed inside the fan-in region FI. The chip wiring structure 131 may be electrically connected to the second chip pad 119 in the fan-in region FI.

The chip wiring structure 131 may be formed in the fan-in region FI through a photolithography process. Since the fan-out semiconductor package 100 includes the chip wiring structure 131 formed in the fan-in region FI through a photolithography process, the design freedom of the second chip 113 may be increased.

The chip wiring structure 131 may include at least one chip wiring element 127 and at least one chip wiring pad 133. The chip wiring element 127 may include chip wiring layers 123 formed in a chip wiring insulation layer 129, and chip vias 125 electrically connecting the chip wiring layers 123 to a second chip pad 119, to a chip wiring pad 133, and/or to one another. The chip wiring pad 133 may be electrically connected to the chip wiring element 127.

The chip wiring pad 133 may be a part of (e.g., included in) the uppermost chip wiring layer 123. The chip wiring element 127 may include the same material as the body wiring structure 104. The chip wiring pad 133 may include the same material as the body wiring pads 107 and 109.

The fan-out semiconductor package 100 may include a first redistribution structure 145. The first redistribution structure 145 may be disposed on the bottom surface of the wiring substrate 106 and the bottom surface of the fan-in chip structure FICS. The first redistribution structure 145 may extend to the fan-out region FO within a first redistribution insulation layer 143 and may include redistributed first redistribution elements 141. The first redistribution elements 141 may include first redistribution layers 137 and first redistribution vias 139 interconnecting the first redistribution layers 137, the first chip pad 117, and/or the first body wiring pad 107.

The first redistribution elements 141 may be electrically connected to the first chip pad 117 in the fan-in region FI. The first redistribution elements 141 may include the same material as the body wiring structure 104.

The first redistribution structure 145 may include first redistribution pads 149 electrically connected to the first redistribution elements 141. A first redistribution pad 149 may be a part of a first redistribution layer 137 located on the top surface of the first redistribution insulation layer 143.

The first redistribution pads 149 may include the same material as the body wiring pads 107 and 109. A barrier metal layer 153 (e.g., a nickel layer and/or a copper layer), may be formed on the first redistribution pads 149. The barrier metal layer 153 may be used as (and/or include) a bump pad. The barrier metal layer 153 may be electrically separated from each other by a first passivation layer 151.

In some embodiments, the bottom surface of the first passivation layer 151 may be coplanar with the bottom surface of the barrier metal layer 153 or the bottom surface of the barrier metal layer 153 may extend past the first passivation layer 151. The first redistribution pads 149 may be electrically separated from each other by the first passivation layer 151. First external connection terminals 167 (e.g., solder balls and/or pillars) may be formed on the barrier metal layer 153.

The fan-out semiconductor package 100 may include an encapsulation layer 135. The encapsulation layer 135 may be formed on the fan-in chip structure FICS embedded in the via hole 101h and the wiring substrate 106. The encapsulation layer 135 may be formed on two opposite side surfaces of the fan-in chip structure FICS in the via hole 101h. The encapsulation layer 135 may surround the fan-in chip structure FICS in the via hole 101h when viewed from above. The encapsulation layer 135 may include, for example, an organic based insulator. For example, the encapsulation layer 135 may include an epoxy molding compound (EMC).

The fan-out semiconductor package 100 may include a second redistribution structure 166. The second redistribution structure 166 may be disposed on the top surface 101a of the wiring substrate 106 and the top surface of the fan-in chip structure FICS. The second redistribution structure 166 may include second redistribution elements 160 formed in the encapsulation layer 135 and insulated by a second redistribution insulation layer 155.

The second redistribution structure 166 may extend to the fan-out region FO and include redistributed second redistribution elements 160. The second redistribution elements 160 may include second redistribution layers 159 and second redistribution vias 157. The second redistribution elements 160 may be electrically connected to the chip wiring pad 133 of the fan-in chip structure FICS.

The second redistribution layers 159 may extend, when viewed from above, from the fan-in region FI to the fan-out region FO. The second redistribution elements 160 may be electrically connected to the second chip pad 119 in the fan-in region FI. Since FIGS. 1 and 2 are cross-sectional views, the second redistribution layers 159 are illustrated as being spaced apart from one another. The second redistribution elements 160 may include the same material as the body wiring structure 104.

The second redistribution structure 166 may include second redistribution pads 163 electrically connected to the second redistribution elements 160. A second redistribution pad 163 may be a part of the second redistribution layer 159. The second redistribution pads 163 may be electrically connected to the second redistribution layers 159.

The second redistribution pads 163 may be electrically isolated by a second passivation layer 161. The second redistribution pads 163 may include the same material as the body wiring pads 107 and 109. The second redistribution pads 163 may be exposed to the outside through pad exposure holes 165. Second external connection terminals (not shown), e.g., second solder balls and/or pillars, may be formed on the second redistribution pads 163.

As described above, the fan-out semiconductor package 100 of the inventive concepts include the stacked chips 115 to improve the integration capacity. Also, since the chip wiring structure 131 formed through a photolithography process in the fan-in region FI is provided, the design freedom of the second chip 113 may be increased.

Figure 3:
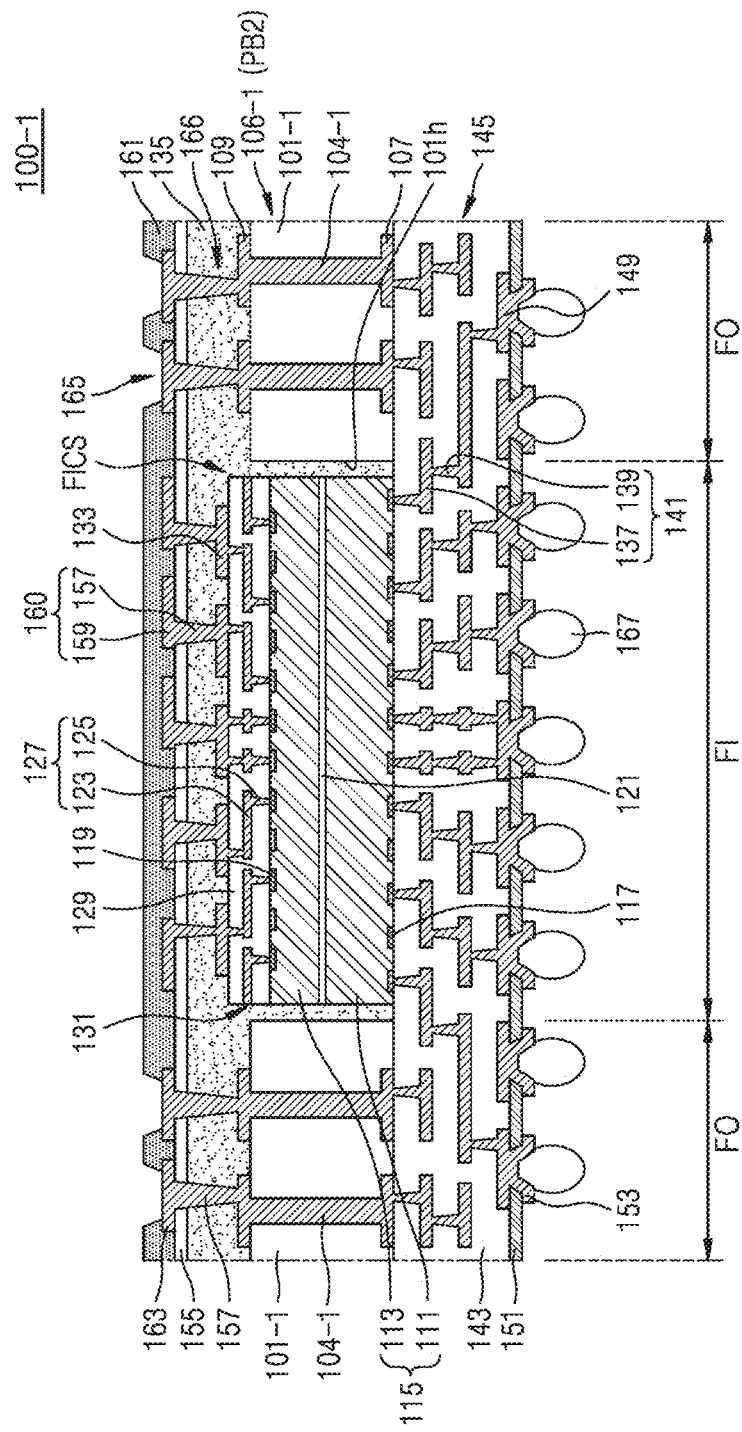
FIG. 3 is a cross-sectional view of a main part of a fan-out semiconductor package according to some example embodiments.

FIG. 3 is a cross-sectional view of a main part of a fan-out semiconductor package 110-1 according to some example embodiments.

The fan-out semiconductor package 100-1 may be substantially the same as the fan-out semiconductor package 100 of FIGS. 1 and 2, except for a wiring substrate 106-1. In FIG. 3, reference numerals identical to those as in FIGS.

1 and 2 denote the same elements. In FIG. 3, descriptions identical to those given above with reference to FIGS. 1 and 2 will be briefly given or omitted.

The fan-out semiconductor package 100-1 includes the wiring substrate 106-1. The wiring substrate 106-1 may be a package body PB2. The wiring substrate 106-1 may be a semiconductor substrate. The wiring substrate 106-1 may be referred to as an interposer substrate. The fan-out semiconductor package 100-1 may be a fan out wafer level package (FOWLP). The wiring substrate 106-1 may include a body 101-1, a body wiring structure 104-1 located in the body 101-1 and the body wiring pads 107 and 109.

The body 101-1 may include a semiconductor material, e.g., a semiconductor element (like silicon or germanium (Ge)) or a compound semiconductor (like silicon carbide (SiC), gallium arsenide (GaAs), indium arsenide (InAs), and/or indium phosphide (InP)). The body wiring structure 104-1 may be a body wiring layer formed in the body 101-1. The body wiring layer 103 may include a conductive material and may include a metal layer (e.g., a copper layer). As described above, the fan-out semiconductor package 100-1 may use a semiconductor substrate as the wiring substrate 106-1.

Figure 4:
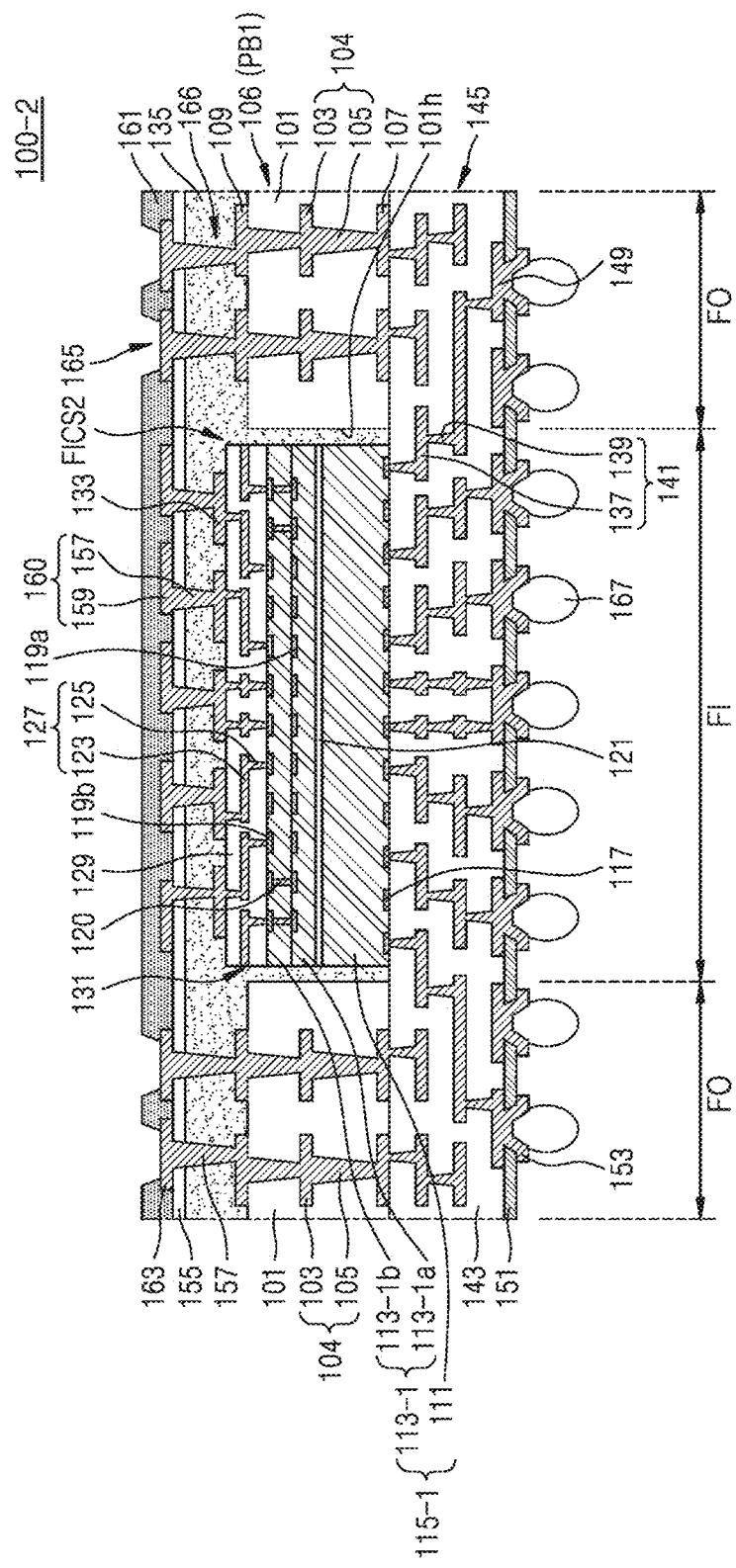
FIG. 4 is a cross-sectional view of a main part of a fan-out semiconductor package according to some example embodiments.

FIG. 4 is a cross-sectional view of a main part of a fan-out semiconductor package 100-2 according to some example embodiments.

The fan-out semiconductor package 100-2 may be substantially the same as the fan-out semiconductor package 100 of FIGS. 1 and 2, except for a fan-in chip structure FICS-2. In FIG. 4, reference numerals identical to those as in FIGS. 1 and 2 denote the same elements. In FIG. 4, descriptions identical to those given above with reference to FIGS. 1 and 2 will be briefly given or omitted.

The fan-out semiconductor package 100-2 includes the fan-in chip structure FICS2. The fan-in chip structure FICS2 may include stacked chips 115-1. The stacked chips 115-1 includes the first chip 111 and a second chip 113-1 bonded onto the first chip 111 via the adhesive layer 121. The second chip 113-1 may include a first sub-chip 113-1a and a second sub-chip 113-1b stacked on the first sub-chip 113-1a and electrically connected to the first sub-chip 113-1a. A second chip pad 119a of the first sub-chip 113-1a and a second chip pad 119b of the second sub-chip 113-1b may be electrically connected to each other via a via 120.

In some embodiments, the first chip 111 may constitute a logic chip, and the second chip 113-1 may constitute a memory chip. As described above, in the fan-out semiconductor package 100-2, the stacked chips 115-1 constituting the fan-in chip structure FICS-2 may be configured in various ways.

Figure 5:
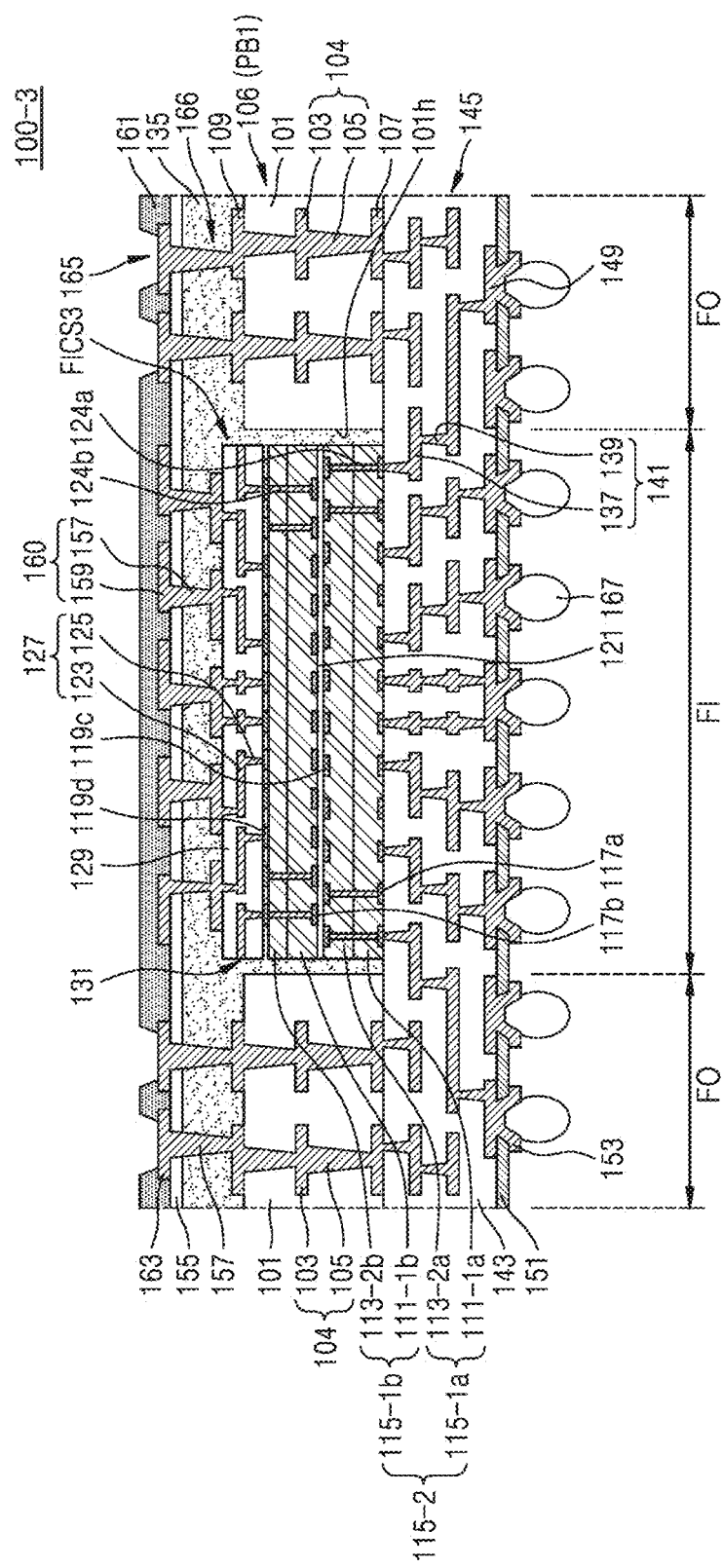
FIG. 5 is a cross-sectional view of a main part of a fan-out semiconductor package according to some example embodiments.

FIG. 5 is a cross-sectional view of a main part of a fan-out semiconductor package 100-3 according to some example embodiments.

The fan-out semiconductor package 100-3 may be substantially the same as the fan-out semiconductor package 100 of FIGS. 1 and 2, except for a fan-in chip structure FICS3. In FIG. 5, reference numerals identical to those as in FIGS. 1 and 2 denote the same elements. In FIG. 5, descriptions identical to those given above with reference to FIGS. 1 and 2 will be briefly given or omitted.

The fan-out semiconductor package 100-3 includes the fan-in chip structure FICS3. The fan-in chip structure FICS3 may include stacked chips 115-2. The stacked chips 115-2 includes a first chip group 115-1a and a second chip group 115-1b bonded onto the first chip group 115-1a via the adhesive layer 121.

The first chip group 115-1a includes a first chip 111-1a and a second chip 113-2a stacked on the first chip 111-1a and electrically connected to the first chip 111-1a. A first chip pad 117a of the first chip 111-1a and a second chip pad 119c of the second chip 113-2a may be electrically connected to each other via a via 124a.

The second chip group 115-1b includes a third chip 111-1b and a fourth chip 113-2b stacked on the third chip 111-1b and electrically connected to the third chip 111-1b. A third chip pad 117b of the third chip 111-1b and a fourth chip pad 119d of the fourth chip 113-2b may be electrically connected to each other via a via 124b. In some embodiments, the first chip 111-1a, the second chip 113-2a, the third chip 111-1b, and the fourth chip 113-2b may each constitute a logic chip and/or a memory chip. As described above, in the fan-out semiconductor package 100-3, the stacked chips 115-2 constituting the fan-in chip structure FICS-3 may be configured in various ways.

Figure 6:
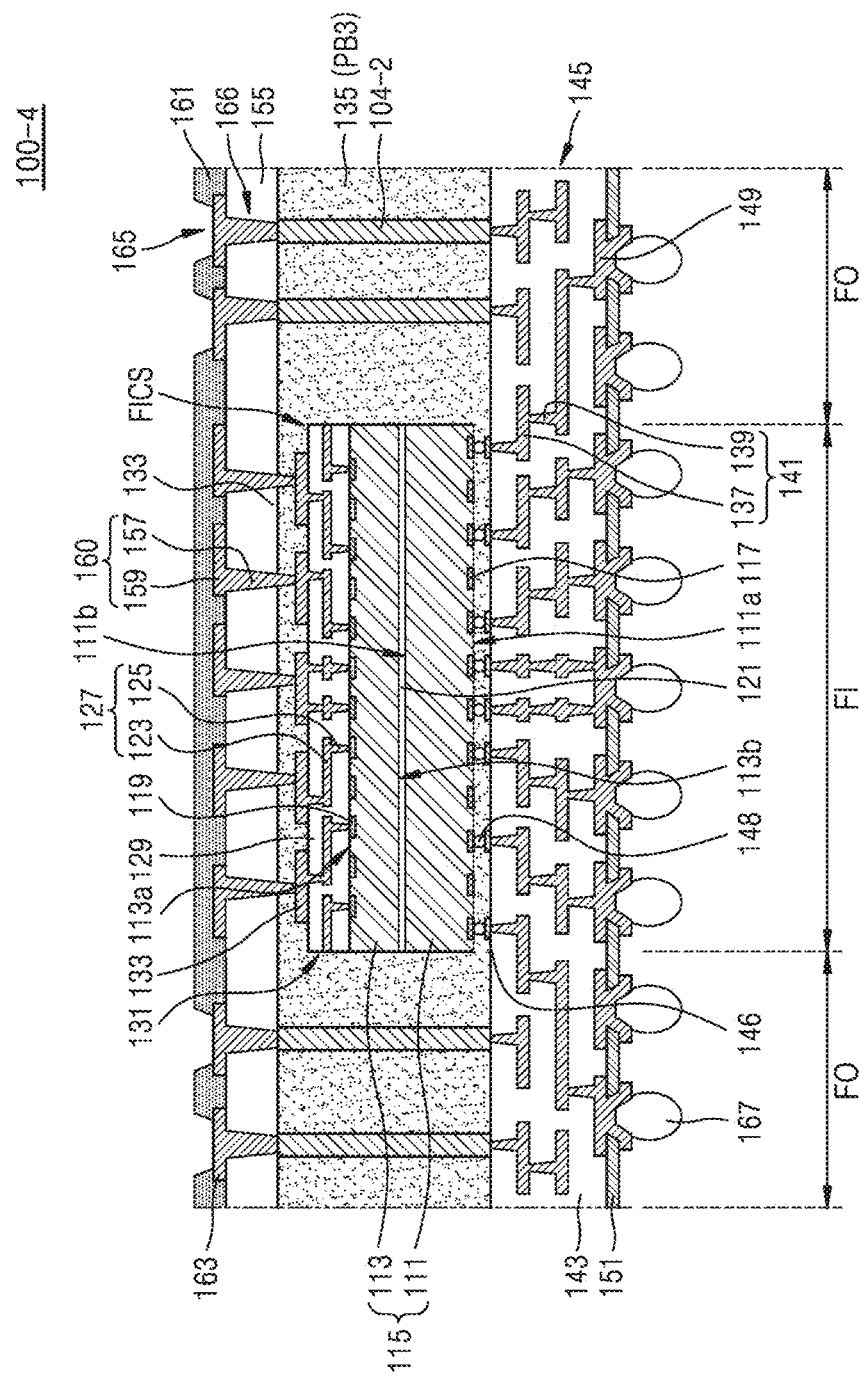
FIG. 6 is a cross-sectional view of a main part of a fan-out semiconductor package according to some example embodiments.

FIG. 6 is a cross-sectional view of a main part of a fan-out semiconductor package 104-2 according to some example embodiments.

The fan-out semiconductor package 100-4 may be substantially the same as the fan-out semiconductor package 100 of FIGS. 1 and 2, except for the package body PB2 and a body wiring structure 104-2. In FIG. 6, reference numerals identical to those as in FIGS. 1 and 2 denote the same elements. In FIG. 6, descriptions identical to those given above with reference to FIGS. 1 and 2 will be briefly given or omitted.

The fan-out semiconductor package 100-4 includes the encapsulation layer 135. The encapsulation layer 135 may be a package body PB3. The fan-out semiconductor package 100-4 may be a FOWLP.

The body wiring structure 104-2 may be formed in the encapsulation layer 135. The body wiring structure 104-2 may include a conductive post such as a metal post (e.g., a copper post). The body wiring structure 104-2 may be a body wiring layer. The second redistribution structure 166 may be formed on the encapsulation layer 135, the fan-in chip structure FICS, and the body wiring structure 104-2. As described above, the fan-out semiconductor package 100-4 may use the encapsulation layer 135 as the package body PB3.

FIGS. 7 to 14 are cross-sectional views showing a method of manufacturing the fan-out semiconductor package of FIGS. 1 and 2 according to some example embodiments.

In detail, in FIGS. 7 to 14, reference numerals identical to those in FIGS. 1 and 2 denote the same elements. In FIGS. 7 to 15, descriptions identical to those given above with reference to FIGS. 1 and 2 will be briefly given or omitted.

Figure 7:
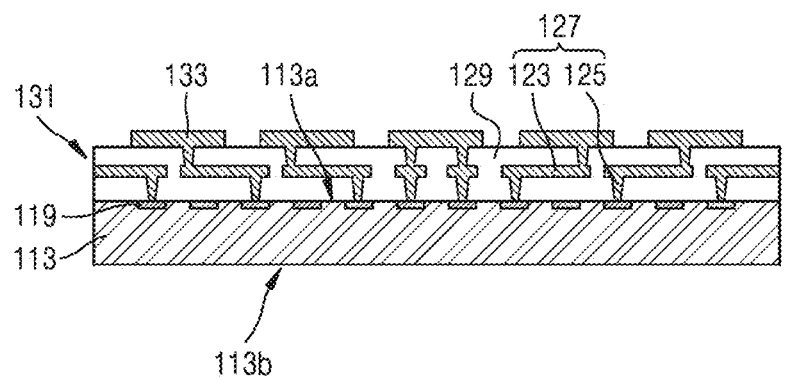
FIGS. 7 to 14 are cross-sectional views showing a method of manufacturing the fan-out semiconductor package of FIGS. 1 and 2 according to an example embodiment.

Referring to FIG. 7, the second chip 113 and the chip wiring structure 131 located on the second chip 113 are formed. First, the second chip 113 is prepared. The second chip 113 may have the top surface 113a and the bottom surface 113b. As described above, the top surface 113a may be an active surface on which individual elements are formed, and the bottom surface 113b may be an inactive surface on which individual elements are not formed. The top surface 113a, which is an active surface on which individual devices are formed, of the second chip 113 may face upward. The second chip pad 119 may be disposed on the top surface 113a of the second chip 113.

Next, the chip wiring structure 131 is formed on the second chip 113. The chip wiring structure 131 may be electrically connected to the second chip pad 119. The chip wiring structure 131 may be formed through a photolithography process. Since the chip wiring structure 131 is formed through a photolithography process, the design freedom of the second chip 113 may be improved.

The chip wiring structure 131 may include the chip wiring element 127 and the chip wiring pad 133. The chip wiring element 127 may include the chip wiring layers 123 formed in the chip wiring insulation layer 129, and the chip vias 125 electrically connecting the chip wiring layers 123 to one another. The chip wiring pad 133 may be electrically connected to the chip wiring element 127. The chip wiring pad 133 may correspond to the uppermost chip wiring layer 123.

Figure 8:
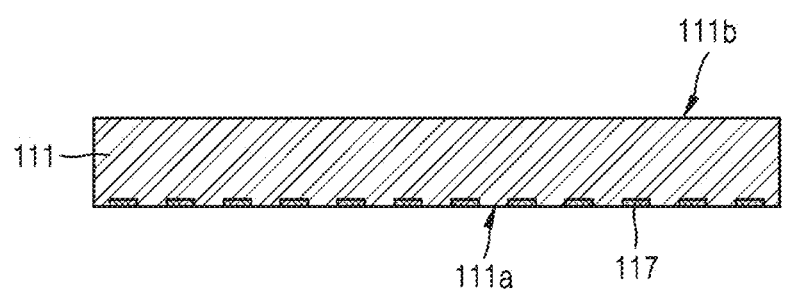

Referring to FIG. 8, the first chip 111 is prepared. The first chip 111 may have the bottom surface 111a and the top surface 111b. The bottom surface 111a may be an active surface on which individual elements are formed, and the top surface 111b may be an inactive surface on which individual elements are not formed. For convenience of explanation, it is illustrated that bottom top surface 111a, which is an active surface on which individual devices are formed, of the first chip 111 faces downward.

Figure 9:
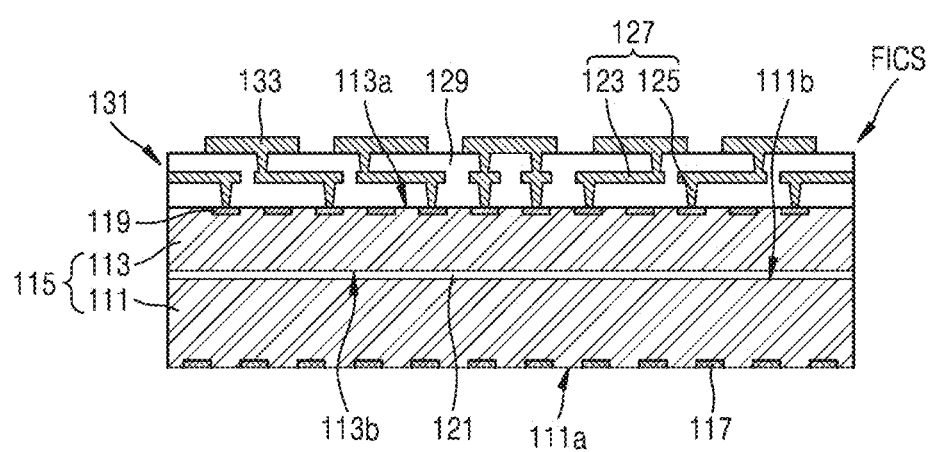

Referring to FIG. 9, the fan-in chip structure FICS is formed. The stacked chips 115 are fabricated by bonding the bottom surface 113b of the second chip 113 to the top surface 111b of the first chip 111 via the adhesive layer 121, such that the chip wiring structure 131 may be formed on the stacked chips 115. Accordingly, the fan-in chip structure FICS including the stacked chips 115 and the chip wiring structure 131 located on the stacked chips 115 may be fabricated.

Figure 10:
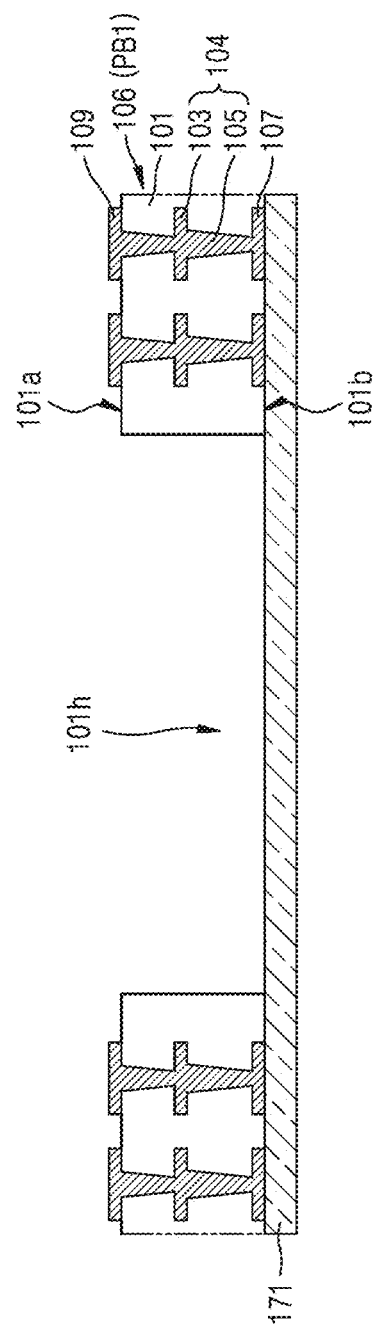

Referring to FIG. 10, the wiring substrate 106 having the via hole 101h is prepared. The wiring substrate 106 constitutes the package body PB1. The wiring substrate 106 may be an insulation substrate. The wiring substrate 106 may include the body 101 positioned on both sides of the via hole 101h, the body wiring structure 104 formed in the body 101, and the body wiring pads 107 and 109.

The body wiring structure 104 may include the body wiring layers 103 formed in the body 101 and the body vias 105 connecting the body wiring layer 103 to one another. The body wiring pads 107 and 109 include the first body wiring pad 107 located on the bottom surface 101b of the body 101 and the second body wiring pad 109 located on the top surface 101a of the body 101. The first body wiring pad 107 may be a part of the body wiring layer 103 located on the bottom surface 101b of the body 101. The second body wiring pad 109 may be a part of the body wiring layer 103 located on the top surface 101a of the body 101.

Subsequently, the wiring substrate 106 in which the via hole 101h is formed is attached to a tape substrate 171. The wiring substrate 106 is attached onto the tape substrate 171, such that the second body wiring pad 109 positioned on the lowermost surface of the body 101 is attached to the tape substrate 171. In this case, the via hole 101h may be located at the center portion of the tape substrate 171, and the body 101 may be located on both sides of the tape substrate 171.

Figure 11:
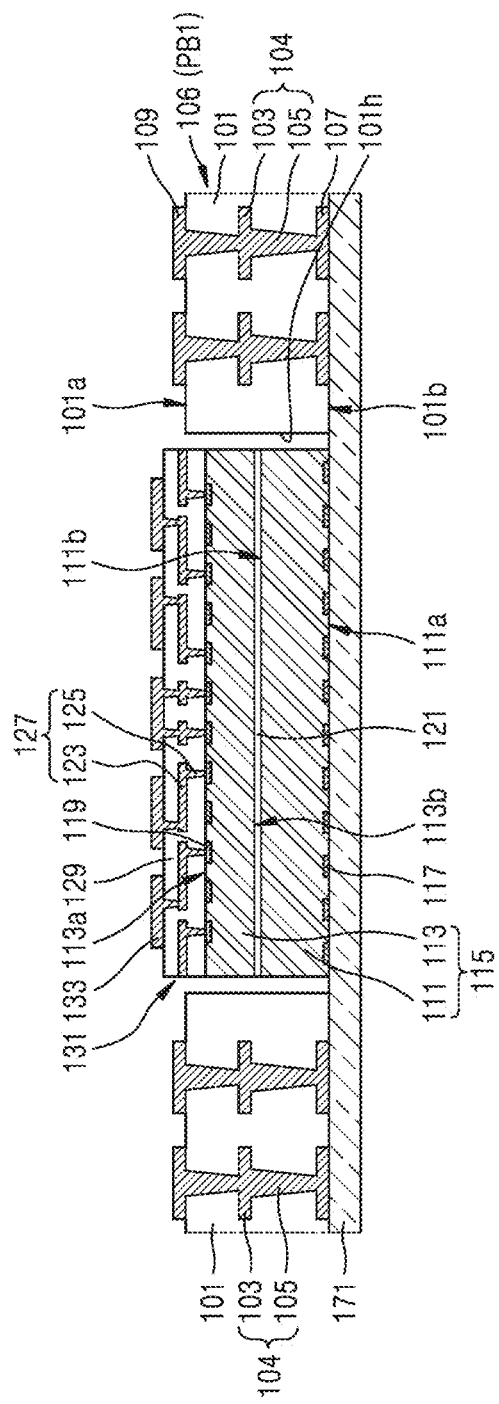

Referring to FIG. 11, the fan-in chip structure FICS is attached to the tape substrate 171 in the via hole 101h of the wiring substrate 106, such that the first chip pad 117 faces downward. The first chip 111 is attached to the tape substrate 171, such that the active surface (e.g., the bottom surface 111a on which the first chip pad 117 is formed) faces downward.

In this case, the fan-in chip structure FICS including the stacked chips 115 including the second chip 113 bonded on the first chip 111 and the chip wiring structure 131 located on the stacked chips 115 may be located in the via hole 101h. The top surface of the chip wiring structure 131 (e.g., the top surface of the chip wiring pad 133) may be located at a higher level than the top surface 101a of the body 101 constituting the wiring substrate 106.

When the fan-in chip structure FICS is attached to the tape substrate 171, the fan-in chip structure FICS may be located to be spaced apart from one side surface of the wiring substrate 106. When the stacked chips 115 are spaced apart from the wiring substrate 106, a surface of the tape substrate 171 may be exposed.

Figure 12:
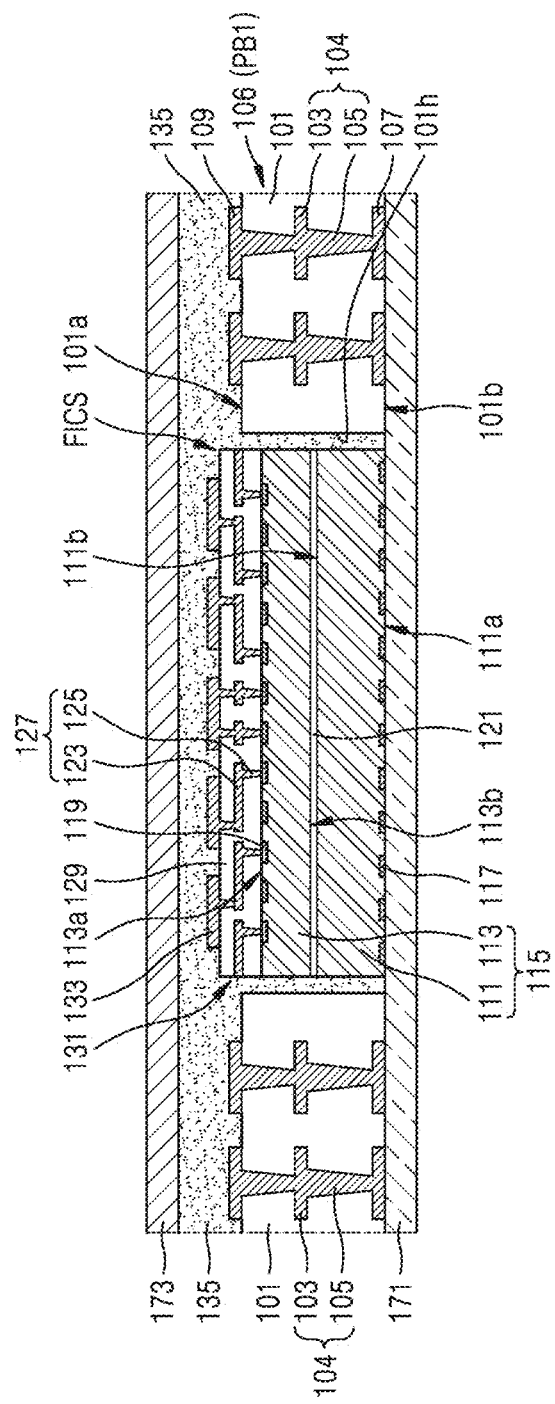

Referring to FIG. 12, the encapsulation layer 135 sealing the fan-in chip structure FICS and the wiring substrate 106 is formed on the tape substrate 171. The encapsulation layer 135 is formed thick to sufficiently seal the fan-in chip structure FICS and the wiring substrate 106. The encapsulation layer 135 is formed to be thicker than the top surface 101a of the body 101 and a surface of the chip wiring structure 131.

Subsequently, a first carrier substrate 173 is attached onto the encapsulation layer 135. The first carrier substrate 173 may be an insulation substrate and/or a semiconductor substrate.

Figure 13:
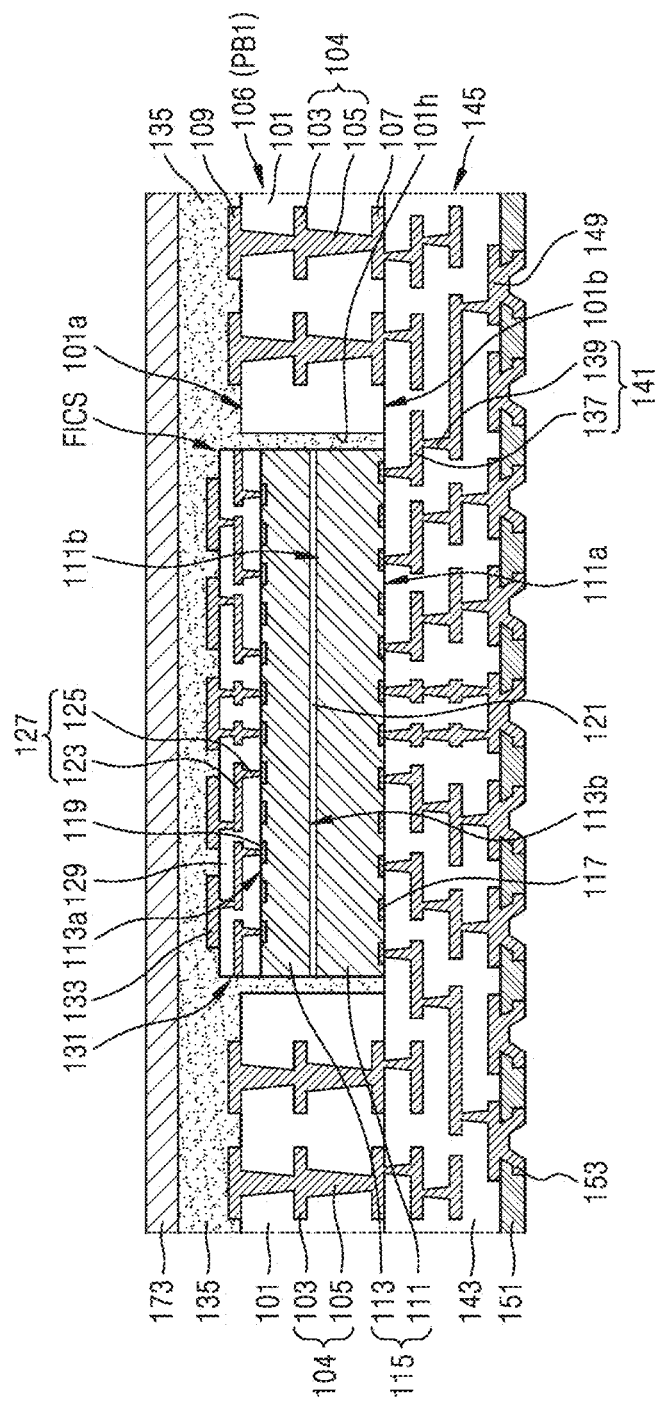

Referring to FIG. 13, the tape substrate (171 of FIG. 11) is removed. Subsequently, the first redistribution structure 145 is formed on the top surface 111a of the first chip 111 and the bottom surface 101b of the body 101 constituting the fan-in chip structure FICS. The first redistribution structure 145 may be disposed on the bottom surface 101b of the body 101 and the bottom surface of the fan-in chip structure FICS.

The first redistribution structure 145 may include the first redistribution insulation layer 143, the first redistribution elements 141, and the first redistribution pads 149. The first redistribution elements 141 may include the first redistribution layers 137 and the first redistribution vias 139 connecting the first redistribution layers 137 to one another.

The first redistribution elements 141 may be electrically connected to the first chip pad 117. As described above, the first redistribution structure 145 may extend to the fan-out region (FO of FIG. 1) and be electrically connected to the first body wiring pad 107.

The first redistribution pads 149 may be electrically connected to the first redistribution structure 145. A first redistribution pad 149 may be a part of a first redistribution layer 137 located on the top surface of the first redistribution insulation layer 143.

Subsequently, the barrier metal layer 153 separated by the first passivation layer 151 may be formed on the first redistribution pads 149. The first passivation layer 151 includes an insulation layer, e.g., an oxide layer or a nitride layer.

Figure 14:
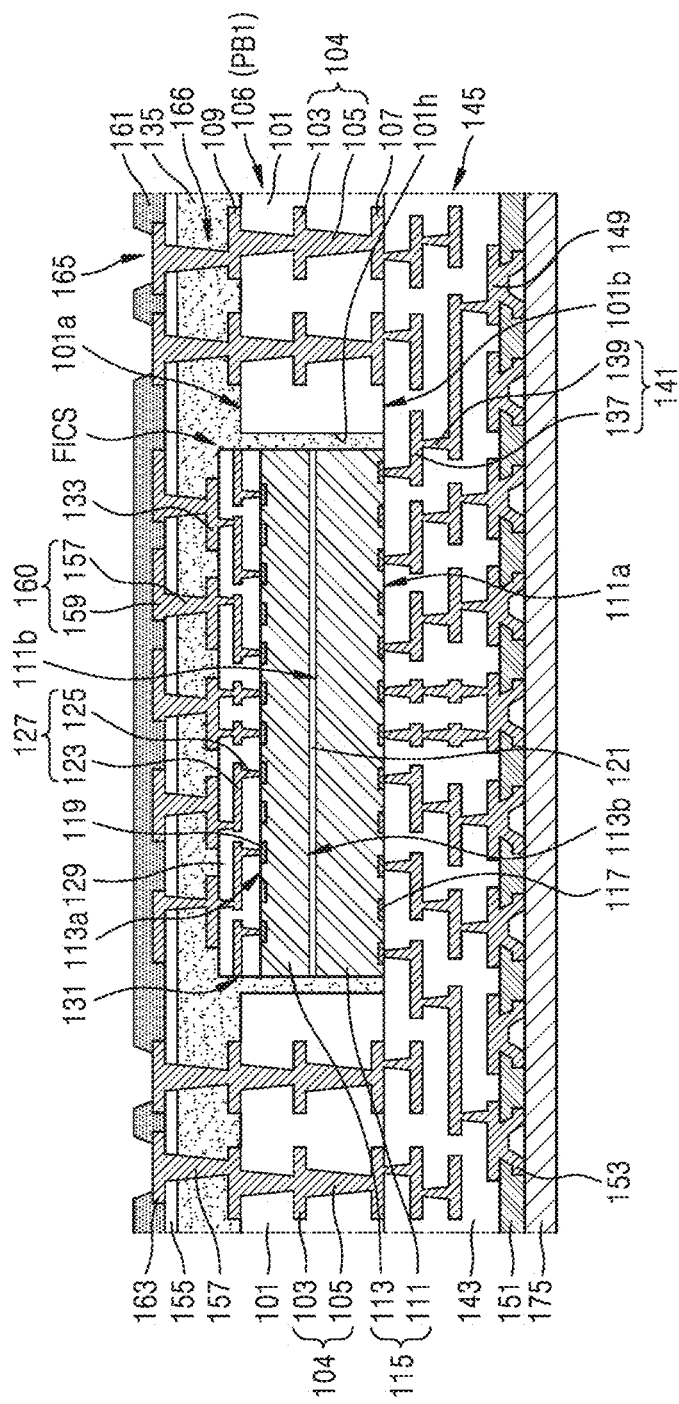

Referring to FIG. 14, the first carrier substrate 173 formed on the encapsulation layer 135 is removed. A second carrier substrate 175 is attached onto the barrier metal layer 153 and the first passivation layer 151. The second carrier substrate 175 may be an insulation substrate or a semiconductor substrate.

Subsequently, the second redistribution structure 166 is formed on the top surface 101a of the wiring substrate 106 and the top surface of the chip wiring structure FICS. The second redistribution structure 166 may include the second redistribution elements 160 formed in the encapsulation layer 135 and insulated by the second redistribution insulation layer 155. The second redistribution elements 160 may include the second redistribution layers 159 and the second redistribution vias 157. The second redistribution elements 160 may be electrically connected to the chip wiring pad 133 of the fan-in chip structure FICS.

The second redistribution layers 159 may extend, when viewed from above, to the fan-out region (FO of FIG. 1) and redistributed. The second redistribution elements 160 may be electrically connected to the second chip pad 119 in the fan-in region FI. The second redistribution structure 166 may include the second redistribution pads 163 electrically connected to the second redistribution elements 160.

A second redistribution pad 163 may be a part of the second redistribution layer 159. The second redistribution pads 163 may be electrically isolated by the second passivation layer 161. The second redistribution pads 163 may be exposed to the outside through the pad exposure holes 165.

Subsequently, the second carrier substrate 175 is removed. When the first external connection terminals 167, e.g., solder balls, are formed on the barrier metal layer 153, the fan-out semiconductor package 100 shown in FIGS. 1 and 2 may be manufactured.

FIGS. 15 to 18 are cross-sectional views showing a method of manufacturing the fan-out semiconductor package of FIG. 6 according to some example embodiments.

When compared to the method shown in FIGS. 7 to 14, the method shown in FIGS. 15 to 18 may be substantially identical to the method shown in FIGS. 7 to 14, except for the order of forming the first redistribution structure 145, the fan-in chip structure FICS, and the second redistribution structure 166.

The method shown in FIGS. 15 to 18 includes sequential formations of the first redistribution structure 145 on the bottom surface 101*b* of the package body (PB2 of FIG. 6), the fan-in chip structure FICS in the package body (PB2 of FIG. 6), and the second redistribution structure 166 on the fan-in chip structure FICS.

In FIGS. 15 to 18, reference numerals identical to those in FIGS. 1, 2, and 6 to 13 denote the same elements. In FIGS. 15 to 18, descriptions identical to those given above with reference to FIGS. 1, 2, and 6 to 13 will be briefly given or omitted.

Figure 15:
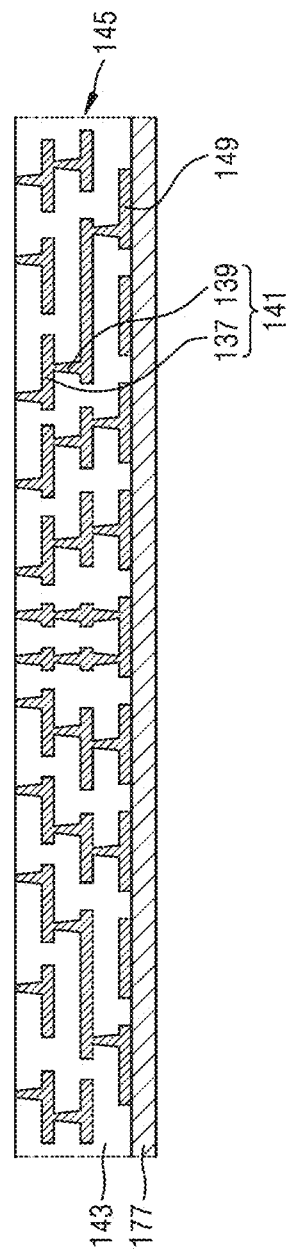
FIGS. 15 to 18 are cross-sectional views showing a method of manufacturing the fan-out semiconductor package of FIG. 6, according to some example embodiments.

Referring to FIG. 15, the first redistribution structure 145 is formed on a carrier substrate 177. The carrier substrate 177 may be an insulation substrate and/or a semiconductor substrate. As described above with reference to FIG. 13, the first redistribution structure 145 may include the first redistribution insulation layer 143, the first redistribution elements 141, and the first redistribution pads 149. The first redistribution elements 141 may include the first redistribution layers 137 and the first redistribution vias 139 connecting the first redistribution layers 137 to one another.

The first redistribution pads 149 may be electrically connected to the first redistribution structure 145. A first redistribution pad 149 may be a part of a first redistribution layer 137 located on the top surface of the first redistribution insulation layer 143. Subsequently, the barrier metal layer 153 separated by the first passivation layer 151 may be formed on the first redistribution pads 149. The first passivation layer 151 includes an insulation layer, e.g., an oxide layer or a nitride layer.

Figure 16:
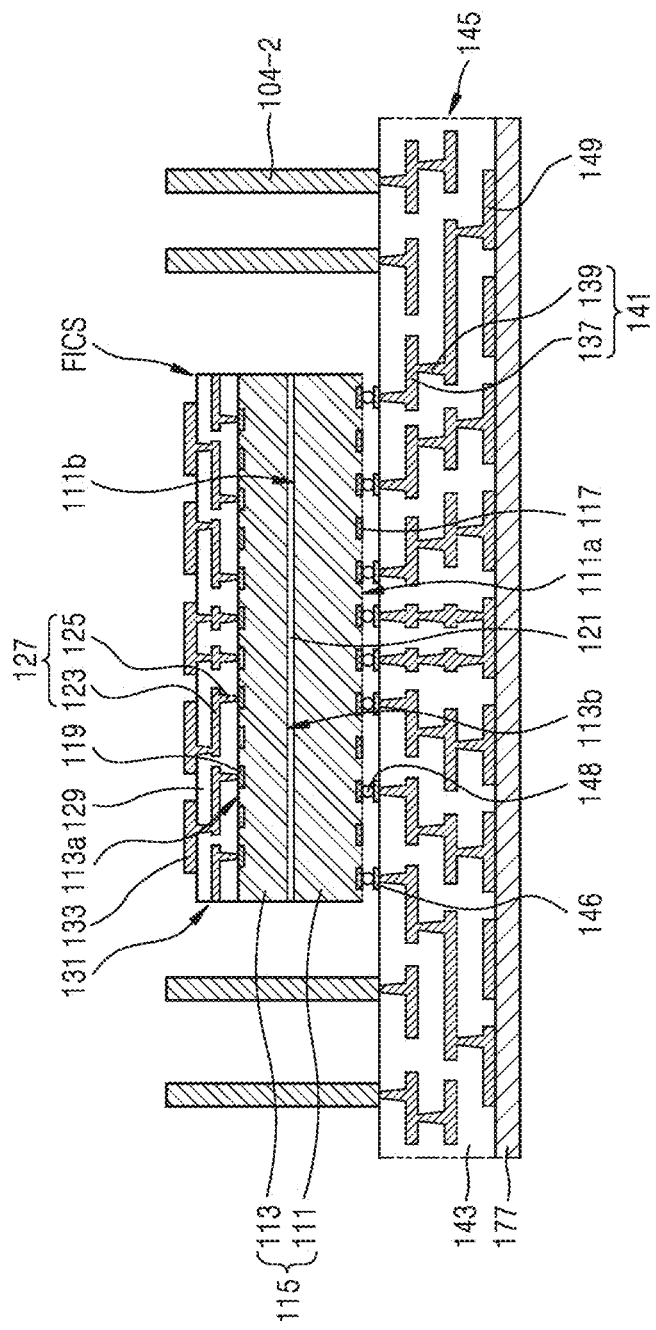

Referring to FIG. 16, ball pads 146 are formed on the first redistribution structure 145. The ball pads 146 may be formed on the first redistribution vias 139 of the first redistribution structure 145. Next, the body wiring structure 104-2 is formed on the first redistribution structure 145. The body wiring structure 104-2 may be formed in the fan-out region (FO of FIG. 6) as shown in FIG. 6. The body wiring structure 104-2 may include a metal post, e.g., a copper post.

Next, the fan-in chip structure FICS including the chip wiring structure 131 as described above with reference to FIGS. 6 to 8 is prepared. Subsequently, the fan-in chip structure FICS, in which the first chip pad 117 faces downward and the chip wiring structure 131 is included via solder balls 148, is mounted on the first redistribution structure 145. As shown in FIG. 6, the fan-in chip structure FICS allows the first chip 111 to be mounted on the fan-in region (FI of FIG. 6), such that the active surface of the first chip 111 (e.g., the bottom surface 111*a* on which the first chip pad 117 is formed) faces downward. The thickness of the body wiring structure 104-2 may be greater than the height (or the thickness) of the fan-in chip structure FICS.

In this case, the fan-in chip structure FICS including the stacked chips 115 including the second chip 113 bonded on the first chip 111 and the chip wiring structure 131 located on the stacked chips 115 may be located in the fan-in region FI. The first chip pad 117 may be electrically connected to the first redistribution elements 141, e.g., the first redistribution vias 139. The solder balls 148 formed on the first chip pad 117 may be electrically connected to the first redistribution elements 141.

Figure 17:
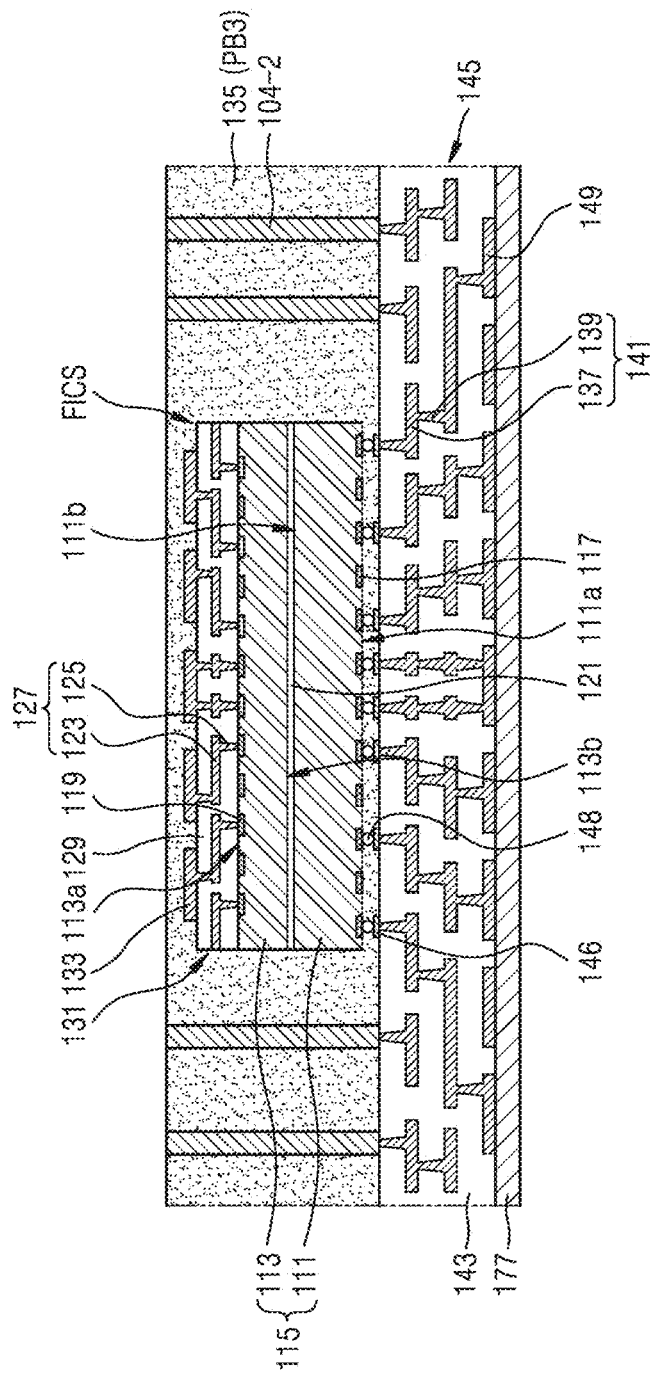

Referring to FIG. 17, the encapsulation layer 135 is formed to a thickness sufficient to seal (and/or encapsulate) the fan-in chip structure FICS and the body wiring structure 104-2 on the first redistribution structure 145. The encapsulation layer 135 may constitute the package body PB3. In some example embodiments, the encapsulation layer 135 may be made coplanar with an upper surface of the body wiring structure 104-2, e.g., through a planarization process.

Figure 18:
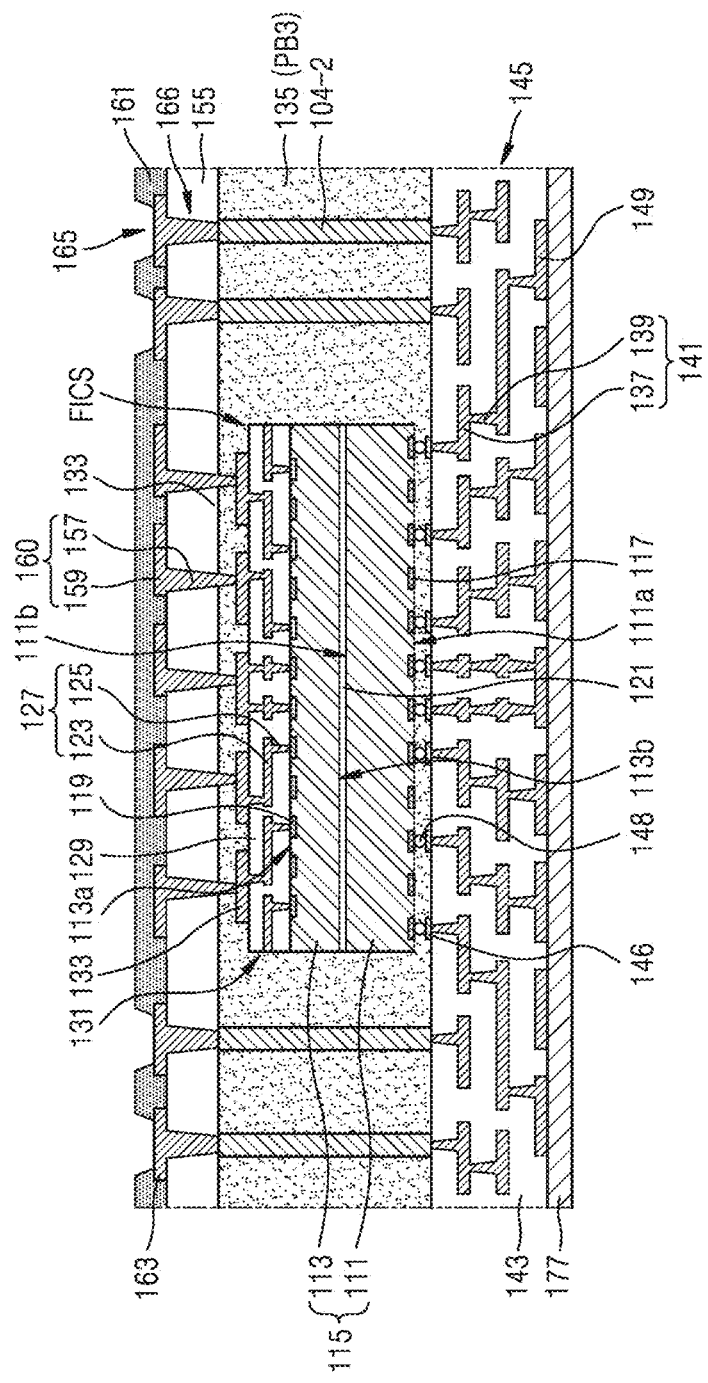

Referring to FIG. 18, the second redistribution structure 166 is formed on the encapsulation layer 135, the fan-in chip structure FICS, and the body wiring structure 104-2. The second redistribution structure 166 may include the second redistribution elements 160 formed in the encapsulation layer 135 and insulated by the second redistribution insulation layer 155. The second redistribution elements 160 may include the second redistribution layers 159 and the second redistribution vias 157. The second redistribution elements 160 may be electrically connected to the chip wiring pad 133 of the fan-in chip structure FICS.

The second redistribution layers 159 may extend, when viewed from above, to the fan-out region (FO of FIG. 6) and redistributed. The second redistribution elements 160 may be electrically connected to the second chip pad 119 in the fan-in region FI. The second redistribution structure 166 may include the second redistribution pads 163 electrically connected to the second redistribution elements 160.

A second redistribution pad 163 may be a part of the second redistribution layer 159. The second redistribution pads 163 may be electrically isolated by the second passivation layer 161. The second redistribution pads 163 may be exposed to the outside through the pad exposure holes 165.

Subsequently, after the carrier substrate 177 is removed, the barrier metal layer 153 may be separated by the first passivation layer 151 is formed on the first redistribution pads 149 as shown in FIG. 6. When the first external connection terminals 167, e.g., solder balls, are formed on the barrier metal layer 153, the fan-out semiconductor package 100-4 may be manufactured.

Figure 19:
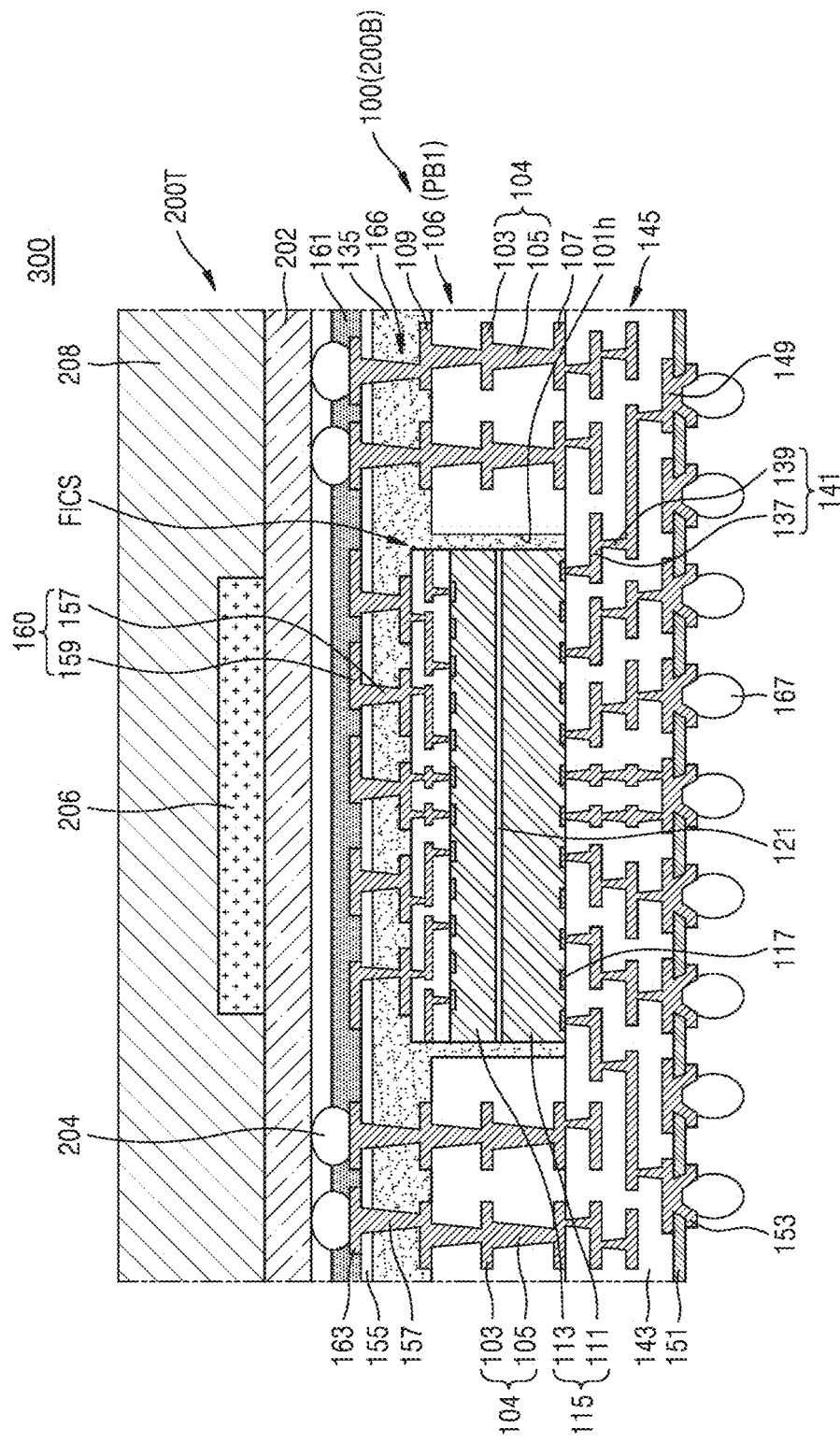
FIG. 19 is a cross-sectional view of a main part of a fan-out semiconductor package according to some example embodiments.

FIG. 19 is a cross-sectional view of a main part of a fan-out semiconductor package 300 according to some example embodiments.

The fan-out semiconductor package 300 may be identical to the fan-out semiconductor package 100 of FIGS. 1 and 2 except the fan-out semiconductor package 300 is a stacked package in which a top package 200T is further stacked on the fan-out semiconductor package 100 of FIGS. 1 and 2. In FIG. 19, descriptions of elements denoted by the same reference numerals as in FIGS. 1 and 2 will be briefly given or omitted. Here, the fan-out semiconductor package 100 of FIGS. 1 and 2 is referred to as a bottom package 200B.

The fan-out semiconductor package 300 may be a stacked package including the bottom package 200B and the top package 200T. Second external connection terminals 204, e.g., second solder balls, may be formed on the second redistribution pads 163 of the bottom package 200B. The top package 200T may be attached onto the second external connection terminals 204.

The top package 200T may include a top chip 206 attached onto a top wiring substrate 202. The top wiring substrate 202 and the top chip 206 may be electrically connected through bonding wires or bumps. For example, the top wiring substrate 202 may include conductive wiring patterns and/or vias (not illustrated) electrically connecting the external connection terminals 204 to the top chip 206. In FIG. 19, the top chip 206 may be connected to the top wiring substrate 202 through bumps (not shown). The top chip 206 may be a memory chip. Examples of the memory chip may be as described above.

The top package 200T may include a top encapsulation layer 208 surrounding at least a portion of the top chip 206. The top encapsulation layer 208 may include, for example, an EMC. Although FIG. 19 shows that the top encapsulation layer 208 covers the inactive surface of the top chip 206 (the top surface of the top chip 206), the example embodiments are not limited thereto.

Figure 20:
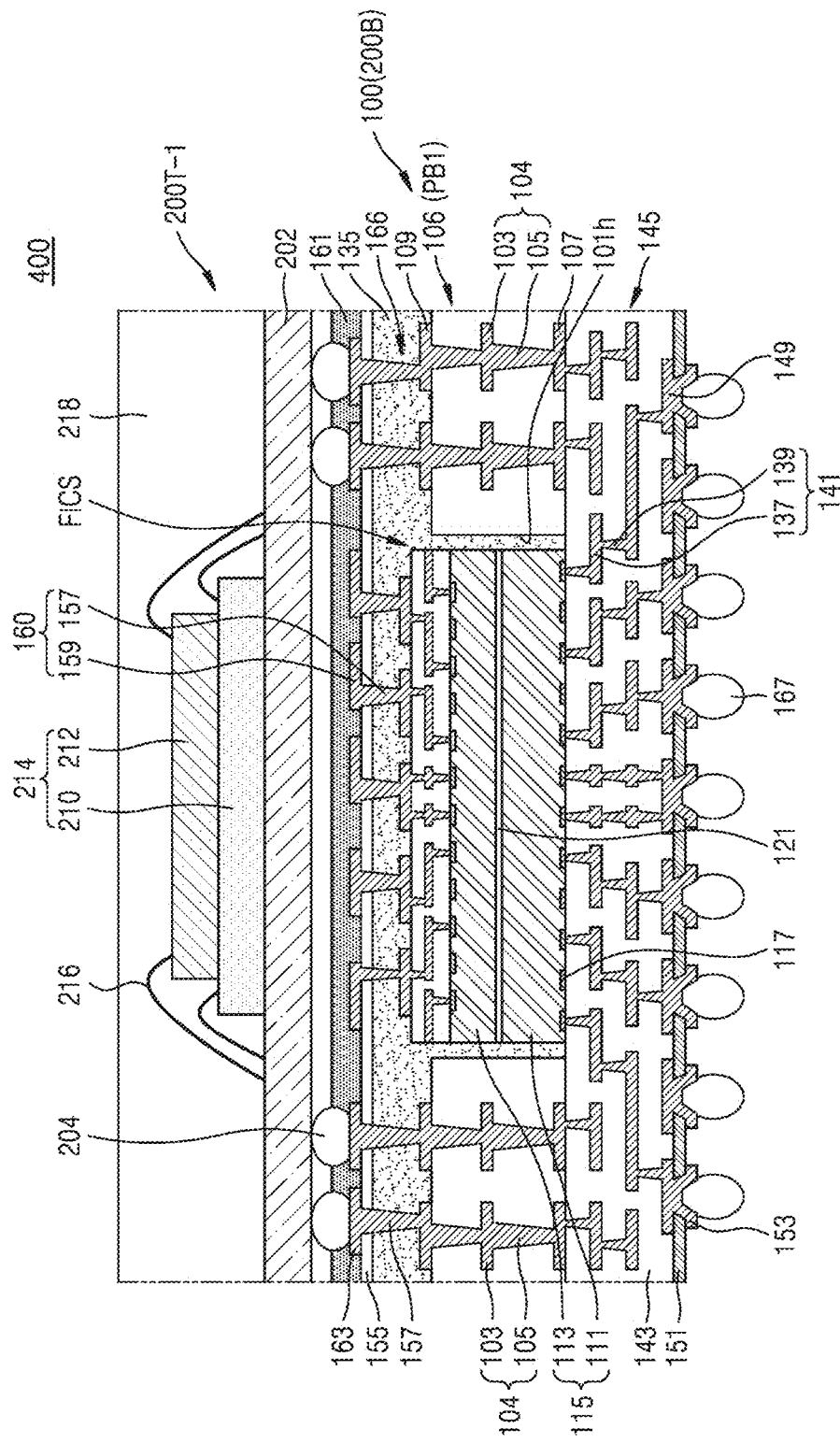
FIG. 20 is a cross-sectional view of a main part of a fan-out semiconductor package according to some example embodiments.

FIG. 20 is a cross-sectional view of a main part of a fan-out semiconductor package 400 according to some example embodiments.

Compared to the fan-out semiconductor package 300 of FIG. 19, a fan-out semiconductor package 400 may be identical to the fan-out semiconductor package 300 of FIG. 19 except that the fan-out semiconductor package 400 is a stacked package in which a top package 200T-1 including a plurality of top chips 231 is stacked. In FIG. 20, descriptions of elements denoted by the same reference numerals as in FIG. 19 will be briefly given or omitted. Here, the fan-out semiconductor package 100 is referred to as the bottom package 200B.

The fan-out semiconductor package 400 may be a stacked package including the bottom package 200B and the top package 200T-1. The second external connection terminals 204, e.g., second solder balls, may be formed on the second redistribution pads 163 of the bottom package 200B. The top package 200T-1 may be attached onto the second external connection terminals 204.

The top package 200T-1 may include a top chip 214 attached onto the top wiring substrate 202. The top chip 214 may include a first top chip 210 and a second top chip 212. The first top chip 210 and the second top chip 212 may be connected to the top wiring substrate 202 through bonding wires 216. The top chip 214 may include a memory chip or a controller chip. The top package 200T-1 may include a top encapsulation layer 218 surrounding at least a portion of the top chip 214.

Figure 21:
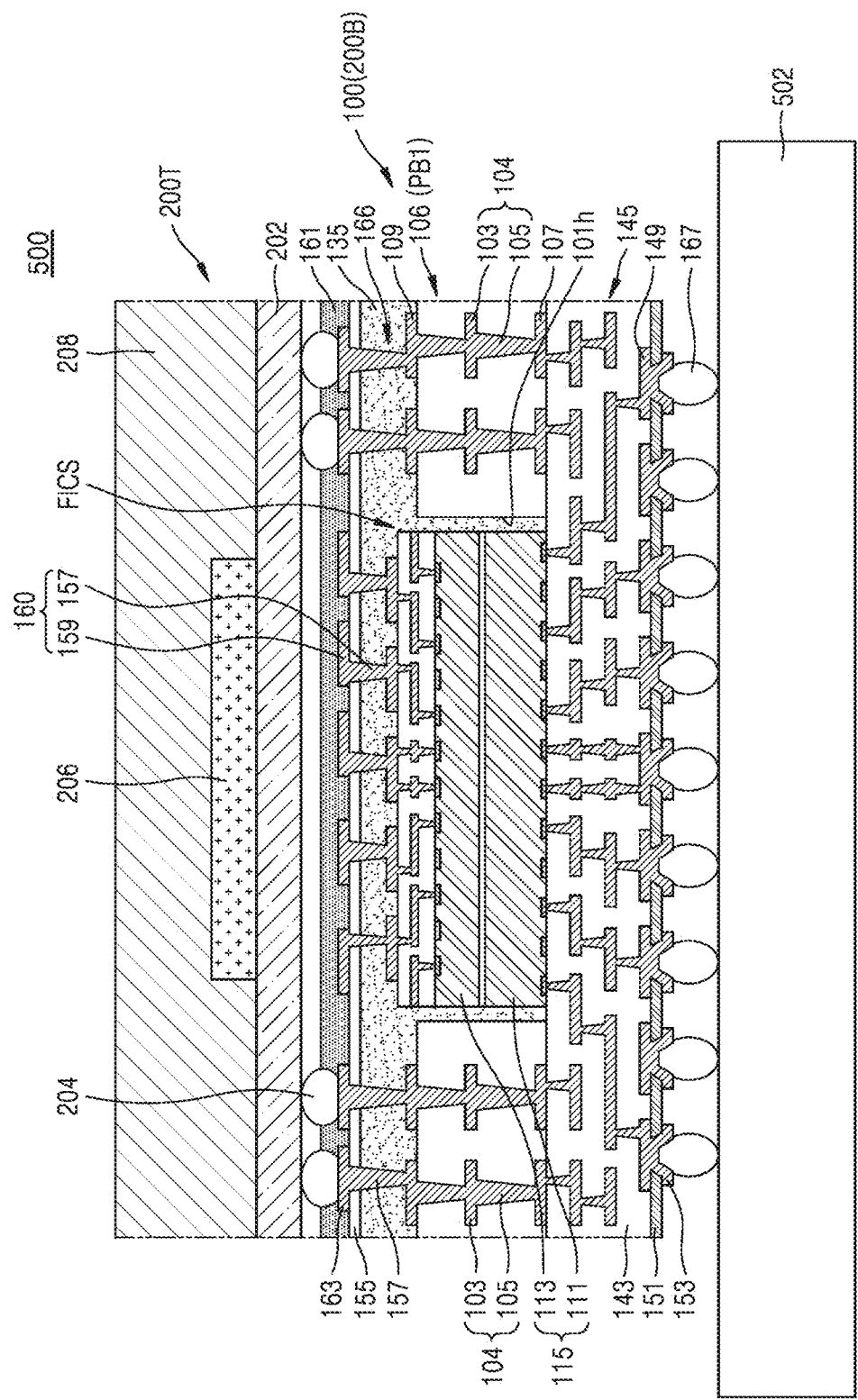
FIG. 21 is a cross-sectional view of a main part of a fan-out semiconductor package according to some example embodiments.

FIG. 21 is a cross-sectional view of a main part of a fan-out semiconductor package 500 according to some example embodiments.

Compared to the fan-out semiconductor package 300 of FIG. 19, a fan-out semiconductor package 500 may be identical to the fan-out semiconductor package 300 of FIG. 19 except that the bottom package 200B is attached onto a motherboard substrate 502. In FIG. 21, descriptions of elements denoted by the same reference numerals as in FIG. 19 will be briefly given or omitted. The fan-out semiconductor package 100 is referred to as the bottom package 200B.

The fan-out semiconductor package 500 may be a stacked package including the motherboard substrate 502, the bottom package 200B, and the top package 200T. The first external connection terminals 167 of the bottom package 200B may be mounted on the motherboard substrate 502.

The motherboard substrate 502 may be a printed circuit board. A plurality of additional semiconductor packages or passive devices may be mounted on the motherboard substrate 502.

Figure 22:
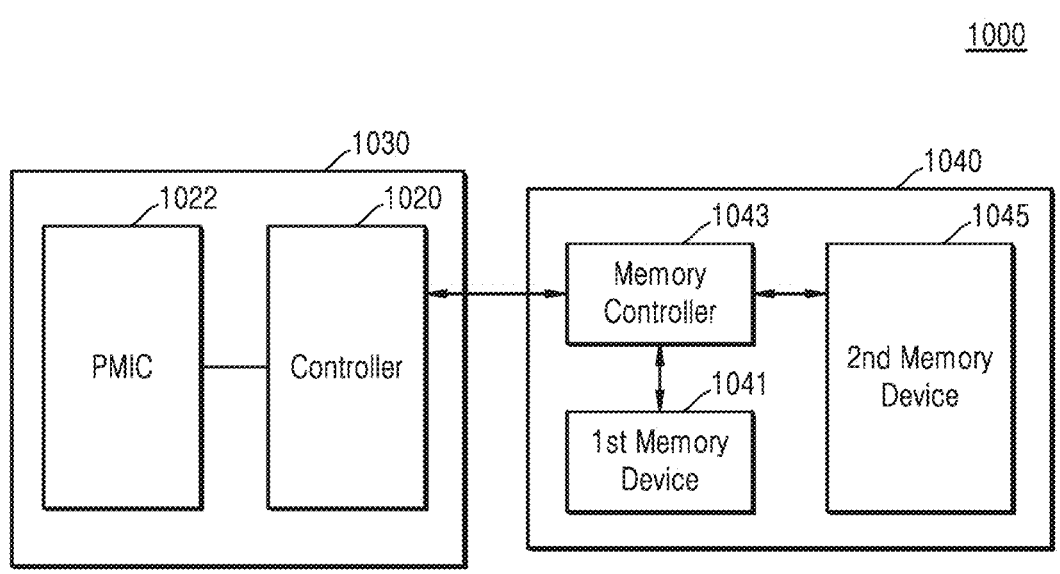
FIG. 22 is a block diagram showing a configuration of a fan-out semiconductor package according to some example embodiments.

FIG. 22 is a block diagram showing a configuration of a fan-out semiconductor package 1000 according to some example embodiments.

The fan-out semiconductor package 1000 may correspond to the fan-out semiconductor packages 100, 100-1, 100-2, and/or 100-3 of the above example embodiments. The fan-out semiconductor package 1000 may include a controller chip 1020, a first memory chip 1041, a second memory chip 1045, and a memory controller 1043. The fan-out semiconductor package 1000 may further include a PMIC 1022 that supplies currents of operating voltages to the controller chip 1020, the first memory chip 1041, the second memory chip 1045, and the memory controller 1043, respectively. Operating voltage applied to respective components may be designed to be the same as or different from one another.

A bottom package 1030 including the controller chip 1020 and the PMIC 1022 may be the bottom package 200B of the example embodiments described above. A top package 1040 including the first memory chip 1041, the second memory chip 1045, and the memory controller 1043 may correspond to the top packages 200T and 200T-1 of the example embodiments described above.

The fan-out semiconductor package 1000 may be implemented to be included in an electronic device such as a personal computer (PC) and/or a mobile device. The mobile devices may be implemented as a laptop computer, a mobile phone, a smartphone, a tablet PC, a personal digital assistant (PDA), an enterprise digital assistants (EDA), a digital still camera, a digital video camera, a portable multimedia player (PMP), a personal navigation device or a portable navigation device (PND), a handheld game console, a mobile internet device (MID), a wearable computer, an internet of things (IoT) device, an internet of everything (IoE) device, a drone, and/or the like.

The controller chip 1020 may control operations of the first memory chip 1041, the second memory chip 1045, and/or the memory controller 1043. For example, the controller chip 1020 may be implemented by an integrated circuit (IC), a system-on-chip (SoC), an application processor (AP), a mobile AP, a chipset, or a set of chips. The controller chip 1020 may include a central processing unit (CPU), a graphics processing unit (GPU), and/or a modem. In some embodiments, the controller chip 1020 may perform the function of a modem and the function of an AP.

The memory controller 1043 may control the second memory chip 1045 according to the control of the controller chip 1020. The first memory chip 1041 may be implemented by a volatile memory device. The volatile memory device may include a random access memory (RAM), a dynamic RAM (DRAM), or a static RAM (SRAM), but is not limited thereto. The second memory chip 1045 may be implemented by a storage memory device. The storage memory device may be implemented by a non-volatile memory device.

The storage memory device (e.g., the first memory chip 1041 and/or the second memory chip 1045) may be implemented by a flash-based memory device but is not limited thereto. For example, the second memory chip 1045 may be implemented by a NAND-type flash memory device. The NAND-type flash memory device may include a 2-dimensional memory cell array or a 3-dimensional memory cell array. The 2-dimensional memory cell array or the 3-dimensional memory cell array may include a plurality of memory cells, and the memory cells may each store 1-bit of data or 2 or more bits of data.

When the second memory chip 1045 is implemented by a flash-based memory device, the memory controller 1043 may use (or support) a multimedia card (MMC) interface, an embedded MMC (eMMC) interface, or a universal flash storage (UFS) interface, but the example embodiments are not limited thereto.

Figure 23:
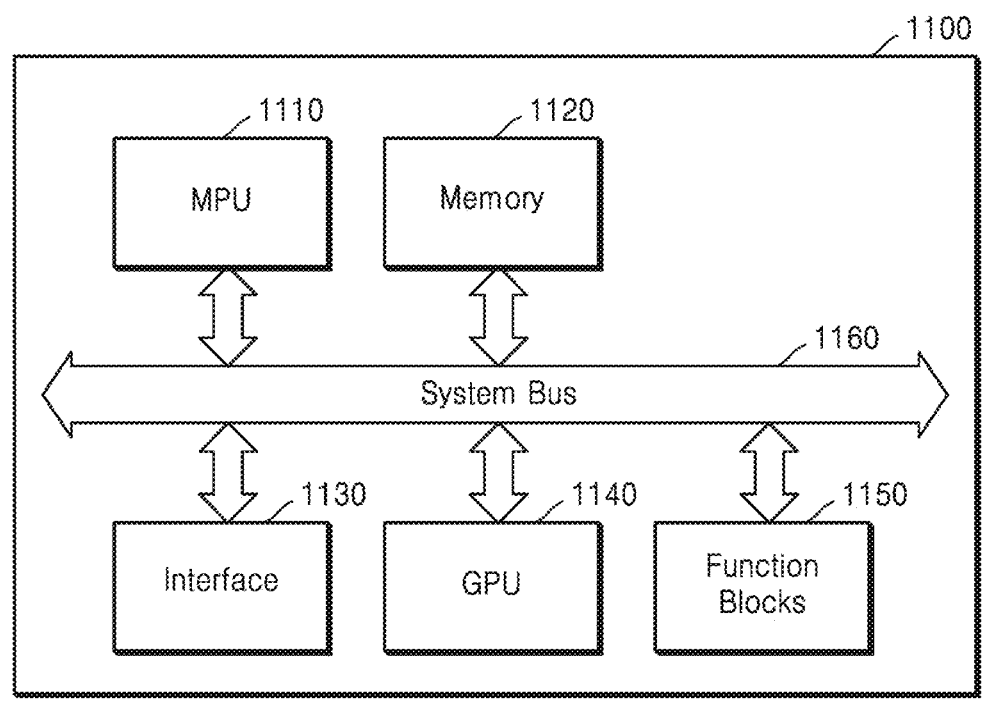
FIG. 23 is a block diagram schematically showing a configuration of a fan-out semiconductor package according to some example embodiments.

FIG. 23 is a block diagram schematically showing a configuration of a fan-out semiconductor package 1100 according to some example embodiments.

The fan-out semiconductor package 1100 may include a microprocessor 1110, a memory 1120, an interface 1130, a graphics processing unit 1140, function blocks 1150, and a bus 1160 connecting them to one another. The fan-out semiconductor package 1100 may include both the microprocessor 1110 and the graphics processing unit 1140 or may include only one of them.

The microprocessor 1110 may include a core and an L2 cache. For example, the microprocessor 1110 may include multi-cores. Cores of the multi-cores may have performance same as or different from one another. Also, the core of the multi-cores may be activated at the same time or may be activated at different times. The memory 1120 may store a result of processing performed by the function blocks 1150 under the control of the microprocessor 1110. For example, a data may be stored in the memory 1120 as the contents stored in the L2 cache of the microprocessor 1110 are flushed. The interface 1130 may interface with external devices. For example, the interface 1130 may interface with a camera, an LCD, and a speaker.

The graphics processing unit 1140 may perform graphic functions. For example, the graphics processing unit 1140 may execute a video codec or process 3D graphics. The function blocks 1150 may perform various functions. For example, when the fan-out semiconductor package 1100 is an AP used in a mobile device, some of the function blocks 1150 may perform a communication function.

The fan-out semiconductor package 1100 may correspond to at least one of the fan-out semiconductor packages 300, 400, or 500 in the example embodiments. The microprocessor 1110 and/or the graphics processing unit 1140 may constitute the bottom package 200B described above. The memory 1120 may correspond to the top packages 200T and 200T-1 described above. The interface 1130 and the function blocks 1150 may correspond to portions of the bottom package 200B described above.

While some example embodiments have been particularly shown and described with reference to embodiments thereof, it will be understood that various changes in form and details may be made therein without departing from the spirit and scope of the following claims.

What is claimed is:

1. A fan-out semiconductor package comprising:
a package body having a fan-in region and a fan-out region, the fan-out region surrounding the fan-in region and including a body wiring structure;
a fan-in chip structure in the fan-in region, the fan-in chip structure comprising a chip and a chip redistribution structure on a top surface of the chip, the top surface of the chip including a chip pad, the chip redistribution structure comprising a chip wiring pad and a chip wiring element between the chip pad and the chip wiring pad and extending from the chip towards the fan-out region;
a first redistribution structure on a bottom surface of the package body and a bottom surface of the fan-in chip structure, the first redistribution structure comprising first redistribution elements extending from the chip towards the fan-out region; and
a second redistribution structure on a top surface of the package body and a top surface of the chip redistribution structure, the second redistribution structure comprising second redistribution elements extending from the chip redistribution structure towards the fan-out region.

2. The fan-out semiconductor package of claim 1, wherein the chip redistribution structure is inside the fan-in region, and
the chip redistribution structure is electrically connected to the chip pad in the fan-in region.

3. The fan-out semiconductor package of claim 1, wherein the second redistribution structure is electrically connected to the chip wiring pad in the fan-in region.

4. The fan-out semiconductor package of claim 1, wherein the chip comprises a second chip pad on a bottom surface of the chip, and
the first redistribution elements are electrically connected to the second chip pad on the bottom surface of the chip in the fan-in region.

5. The fan-out semiconductor package of claim 1, wherein the package body comprises a wiring substrate including a via hole in an inner region of the wiring substrate, and
the fan-in chip structure is in the via hole and sealed by an encapsulation layer.

6. The fan-out semiconductor package of claim 1, wherein the first redistribution structure further comprises:
first redistribution pads electrically connected to the first redistribution elements, and
first external connection terminals are on the first redistribution pads.

7. The fan-out semiconductor package of claim 1, wherein the second redistribution structure further comprises:
second redistribution pads electrically connected to the second redistribution elements, and
second external connection terminals on the second redistribution pads.

8. The fan-out semiconductor package of claim 1, wherein the package body comprises:
a wiring substrate including a via hole in an inner region of the wiring substrate;
a first body wiring pad on the bottom surface of the package body, the first body wiring pad electrically connected to the body wiring structure; and
a second body wiring pad located on the top surface of the package body, the second body wiring pad electrically connected to the body wiring structure, and
wherein the first redistribution structure is electrically connected to the first body wiring pad in the fan-out region, and the second redistribution structure is electrically connected to the second body wiring pad in the fan-out region.

9. The fan-out semiconductor package of claim 1, further comprising:
an encapsulation layer in the fan-out region and the fan-in region, the encapsulation layer configured to seal the fan-in chip structure in the fan-in region.

10. A fan-out semiconductor package comprising:
a package body having a fan-in region and a fan-out region, the fan-out region surrounding the fan-in region and including a body wiring structure;
a fan-in chip structure in the fan-in region, the fan-in chip structure comprising a first chip, a second chip bonded to the first chip, and a chip wiring structure on a top surface of the second chip, the top surface of the second chip including a chip pad, the chip wiring structure comprising a chip wiring pad and a chip wiring element between the chip wiring pad and the chip pad and extending from the second chip towards the fan-out region;
a first redistribution structure on a bottom surface of the package body and a bottom surface of the first chip, the first redistribution structure comprising first redistribution elements extending from the first chip towards the fan-out region; and
a second redistribution structure on a top surface of the package body and a top surface of the chip wiring structure, the second redistribution structure comprising second redistribution elements extending from the chip wiring structure towards the fan-out region.

11. The fan-out semiconductor package of claim 10, wherein inactive surfaces of the first chip and the second chip are bonded, and the bottom surface of the first chip and the top surface of the second chip are active surfaces.

12. The fan-out semiconductor package of claim 10, wherein
the chip wiring structure is inside the fan-in region but not the fan-out region, and
the chip wiring structure is electrically connected to the chip pad in the fan-in region.

13. The fan-out semiconductor package of claim 10, wherein
the second redistribution elements are electrically connected to the chip wiring pad in the fan-in region.

14. The fan-out semiconductor package of claim 10, wherein
the first chip comprises a second chip pad on the bottom surface of the first chip, and
the first redistribution elements are electrically connected to the second chip pad on the bottom surface of the first chip in the fan-in region.

15. The fan-out semiconductor package of claim 10, wherein
the package body comprises a wiring substrate including a via hole in an inner region of the wiring substrate,
the fan-in chip structure is in the via hole of the wiring substrate and sealed by an encapsulation layer.

16. The fan-out semiconductor package of claim 10, further comprising:
an encapsulation layer in the fan-out region and the fan-in region, the encapsulation layer sealing the fan-in chip structure,
wherein the body wiring structure is in the encapsulation layer and electrically connects the first redistribution structure and the second redistribution structure.

17. A fan-out semiconductor package comprising:
a package body having a fan-in region and a fan-out region, the fan-out region surrounding the fan-in region and including a body wiring structure;
a fan-in chip structure in the fan-in region, the fan-in chip structure comprising stacked chips and a chip wiring structure on a top surface of the stacked chips, the top surface of the stacked chips including a chip pad, the chip wiring structure comprising a chip wiring pad and a chip wiring element between the chip wiring pad and the chip pad and extending from the stacked chips towards the fan-out region;
a first redistribution structure on a bottom surface of the package body and a bottom surface of the fan-in chip structure, the first redistribution structure comprising first redistribution elements extending from the stacked chips towards the fan-out region; and
a second redistribution structure on a top surface of the package body and a top surface of the chip wiring structure, the second redistribution structure comprising second redistribution elements extending from the chip wiring structure towards the fan-out region.

18. The fan-out semiconductor package of claim 17, wherein
the stacked chips comprise a first chip and a second chip bonded to the first chip, and
the second chip comprises a first sub-chip and a second sub-chip stacked on the first sub-chip and electrically connected to the first sub-chip.

19. The fan-out semiconductor package of claim 17, wherein
the stacked chips comprise a first chip group and a second chip group bonded to the first chip group,
the first chip group comprises a first chip and a second chip stacked on the first chip and electrically connected to the first chip, and
the second chip group comprises a third chip and a fourth chip stacked on the third chip and electrically connected to the third chip.

20. The fan-out semiconductor package of claim 17, wherein the stacked chips comprise:
a first chip;
a second chip bonded to the first chip; and
the chip pad on the top surface of the second chip, and
wherein the chip wiring structure is inside the fan-in region but not the fan-out region, and
the chip wiring structure is electrically connected to the chip pad in the fan-in region.

* * * * *